US011678494B2

(12) United States Patent
Chang et al.

(10) Patent No.: US 11,678,494 B2
(45) Date of Patent: Jun. 13, 2023

(54) MEMORY LAYOUT FOR REDUCED LINE LOADING

(71) Applicant: Taiwan Semiconductor Manufacturing Co., Ltd., Hsin-Chu (TW)

(72) Inventors: Chih-Yang Chang, Yuanlin Township (TW); Wen-Ting Chu, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 503 days.

(21) Appl. No.: 16/934,192

(22) Filed: Jul. 21, 2020

(65) Prior Publication Data

US 2020/0350369 A1    Nov. 5, 2020

Related U.S. Application Data

(62) Division of application No. 16/156,026, filed on Oct. 10, 2018, now Pat. No. 10,727,275.

(Continued)

(51) Int. Cl.
*H01L 21/768* (2006.01)
*H01L 27/24* (2006.01)
(Continued)

(52) U.S. Cl.
CPC ...... *H01L 27/2436* (2013.01); *H01L 21/7684* (2013.01); *H01L 21/76802* (2013.01);
(Continued)

(58) Field of Classification Search
CPC ... H01L 45/16; H01L 27/2436; H01L 23/528; H01L 23/5221; H01L 21/76877–76883; H01L 21/7684; H01L 21/76801–76813
See application file for complete search history.

(56) References Cited

U.S. PATENT DOCUMENTS

| 6,272,046 B1 | 8/2001 | Shimada |
| 10,236,364 B1 * | 3/2019 | Cheng ............... H01L 29/456 |
| 2004/0100814 A1 | 5/2004 | Hsu |
| 2005/0248352 A1 | 11/2005 | Chih et al. |

(Continued)

FOREIGN PATENT DOCUMENTS

KR    20110137113 A    12/2011

OTHER PUBLICATIONS

Notice of Allowance dated Mar. 11, 2020 for U.S. Appl. No. 16/156,026.

*Primary Examiner* — Grant S Withers
(74) *Attorney, Agent, or Firm* — Eschweiler & Potashnik, LLC

(57) ABSTRACT

Various embodiments of the present application are directed a memory layout for reduced line loading. In some embodiments, a memory device comprises an array of bit cells, a first conductive line, a second conductive line, and a plurality of conductive bridges. The first and second conductive lines may, for example, be source lines or some other conductive lines. The array of bit cells comprises a plurality of rows and a plurality of columns, and the plurality of columns comprise a first column and a second column. The first conductive line extends along the first column and is electrically coupled to bit cells in the first column. The second conductive line extends along the second column and is electrically coupled to bit cells in the second column. The conductive bridges extend from the first conductive line to the second conductive line and electrically couple the first and second conductive lines together.

20 Claims, 13 Drawing Sheets

Related U.S. Application Data

(60) Provisional application No. 62/673,233, filed on May 18, 2018.

(51) Int. Cl.
*H01L 23/528* (2006.01)
*H01L 23/522* (2006.01)
*H01L 45/00* (2006.01)

(52) U.S. Cl.
CPC ...... *H01L 21/76877* (2013.01); *H01L 23/528* (2013.01); *H01L 23/5221* (2013.01); *H01L 45/16* (2013.01)

(56) References Cited

U.S. PATENT DOCUMENTS

| | | | |
|---|---|---|---|
| 2005/0285207 A1 | 12/2005 | Kim | |
| 2007/0020829 A1* | 1/2007 | Hotta | H01L 23/528 |
| | | | 257/E23.15 |
| 2007/0057308 A1* | 3/2007 | Min | H01L 45/1233 |
| | | | 257/314 |
| 2007/0247893 A1 | 10/2007 | Bednorz et al. | |
| 2009/0161413 A1 | 6/2009 | Yoon et al. | |
| 2012/0097916 A1* | 4/2012 | Tada | H01L 45/1625 |
| | | | 257/4 |
| 2013/0126823 A1 | 5/2013 | Satoh et al. | |
| 2013/0148415 A1 | 6/2013 | Shu et al. | |
| 2017/0110461 A1 | 4/2017 | Fujiwara et al. | |
| 2017/0236839 A1* | 8/2017 | Yamazaki | H01L 27/0688 |
| | | | 257/43 |
| 2019/0081102 A1* | 3/2019 | Park | H01L 23/53266 |

\* cited by examiner

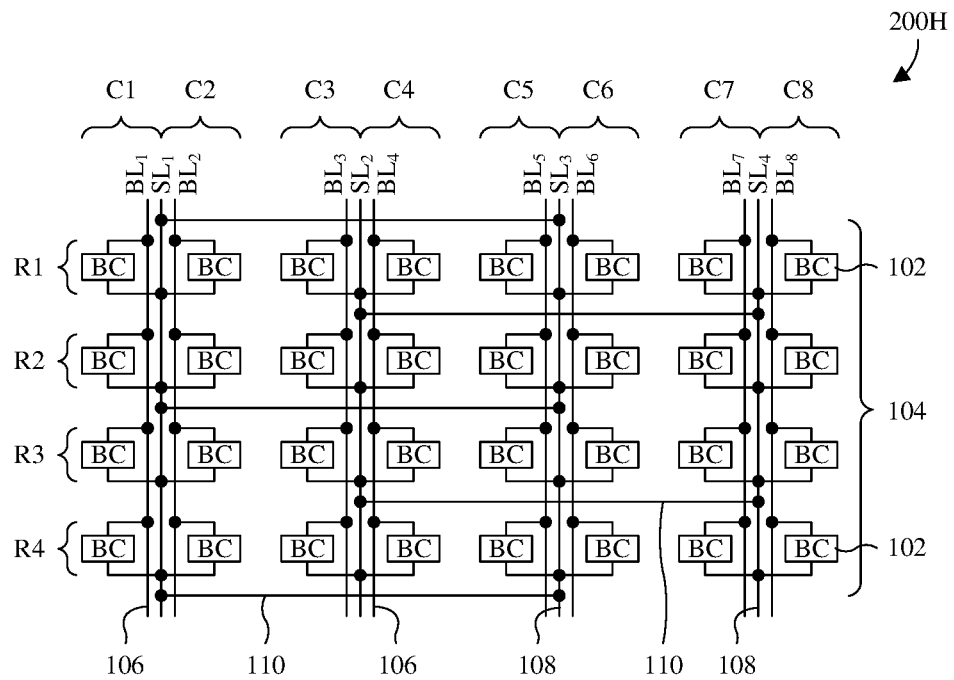
Fig. 2H
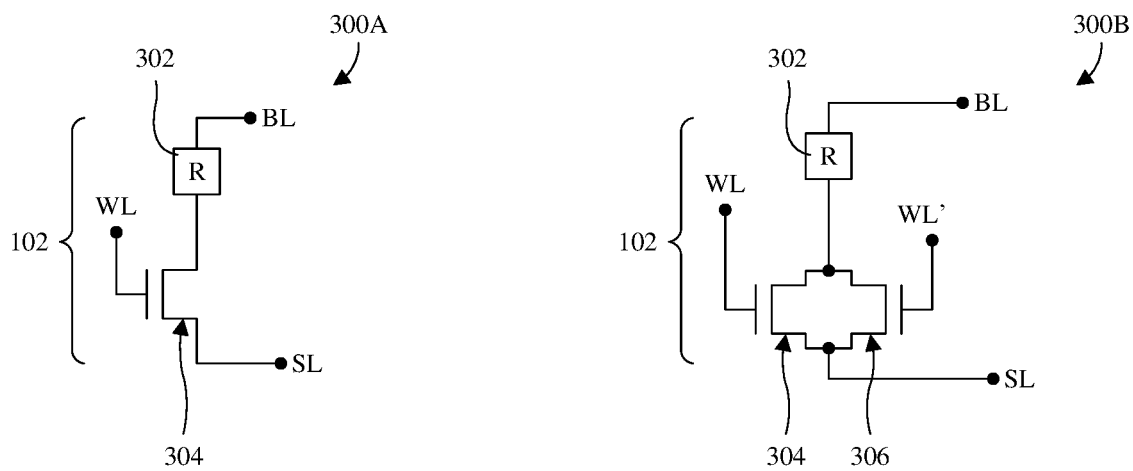
Fig. 3A  Fig. 3B

MEMORY LAYOUT FOR REDUCED LINE LOADING

REFERENCE TO RELATED APPLICATIONS

This application is a Divisional of U.S. patent application Ser. No. 16/156,026, filed on Oct. 10, 2018, which claims the benefit of U.S. Provisional Application No. 62/673,233, filed on May 18, 2018. The contents of the above-referenced Patent Applications are hereby incorporated by reference in their entirety.

BACKGROUND

Many modern day electronic devices include non-volatile memory. Non-volatile memory is electronic memory that is able to store data in the absence of power. Some promising candidates for the next generation of non-volatile memory include resistive random-access memory (RRAM). RRAM has a relatively simple structure and is compatible with complementary metal-oxide-semiconductor (CMOS) logic fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2H illustrate block diagrams of various embodiments of the memory device of FIG. 1 with different conductive-bridge configurations.

FIGS. 3A and 3B illustrate block diagrams of various embodiments of bit cells in the memory device of any one of FIGS. 1 and 2A-2G.

DETAILED DESCRIPTION

Figure 1:
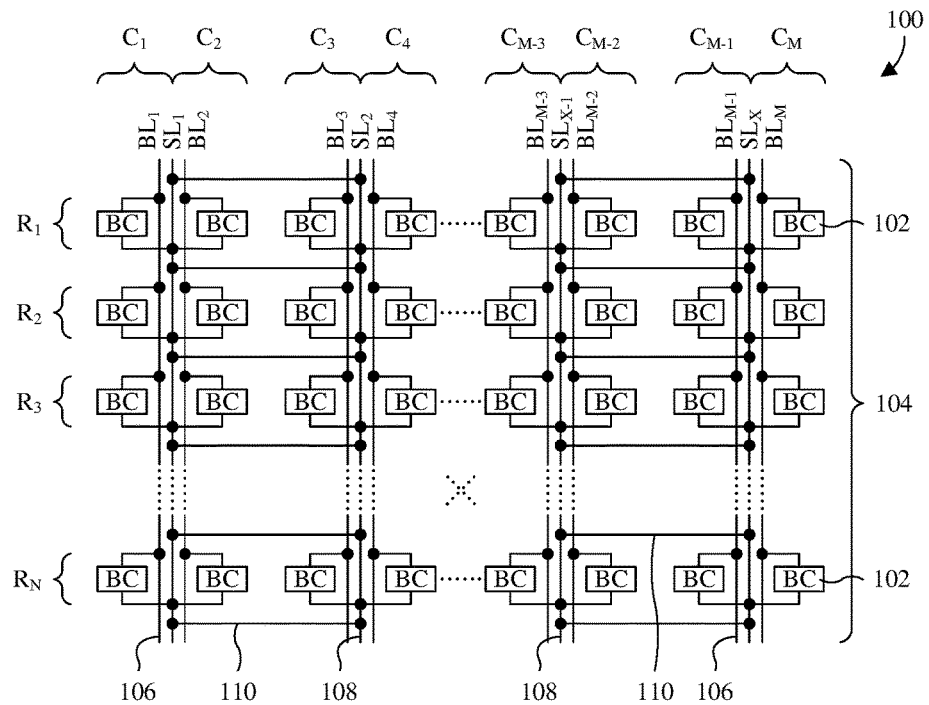
FIG. 1 illustrates a block diagram of some embodiments of a memory device with a layout for reduced line loading.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A resistive random-access memory (RRAM) memory device comprises one or more banks of bit cells, where each bank comprises a plurality of bit cells. The bit cells are arranged in a plurality of rows and a plurality of columns, and each comprises an access transistor and a RRAM structure. The RRAM structure comprises a top electrode, a bottom electrode, and a metal oxide element sandwiched between the top and bottom electrodes. The metal oxide element has a variable resistance representing a bit of data. For example, a low resistance state of the metal oxide element may represent a binary "1", whereas a high resistance state of the metal oxide element may represent a binary "0". By applying a set voltage from the top electrode to the bottom electrode, the metal oxide element may be changed to the low resistance state. By applying a reset voltage from the top electrode to the bottom electrode, the metal oxide element may be changed to the high resistance state. The access transistor is electrically coupled in series with the RRAM structure via the bottom electrode.

Each bank of bit cells further comprises a plurality of word lines, a plurality of bit lines, and a plurality of source lines. The word lines each extend along a corresponding row and electrically couple with gate electrodes of access transistors in the corresponding row. The bit lines each extend along a corresponding column and electrically couple with top electrodes of RRAM structures in the corresponding column. The source lines each extend along a corresponding column and selectively electrically couple with bottom electrodes of RRAM structures in the corresponding column via access transistors in the corresponding column. The word lines allow access to the bit cells on a row-by-row basis, whereas the source and bit lines allow data to be written to or read from accessed bit cells on a column-by-column basis.

A bank of bit cells often has between 128 rows and 512 rows. However, this leads to long source and bit lines, whereby the source and bit lines have high loads. The high loads may, in turn, lead to high minimum read voltages and high minimum write voltages on the source and bit lines. Read voltages and write voltages below the high minimum read voltages and the high minimum write voltages lead to instability while reading from and writing to the bit cells. Further, the high minimum read voltages and the high minimum write voltages may, in turn, lead to high dynamic power consumption. One solution to mitigate the effects of long source and bit lines is to use smaller banks of bit cells. For example, one large bank of bit cells with 128 rows may be replaced with two small banks of bit cells each with 64 rows. However, increasing the number of banks of bit cells increases the area used by the bit cells, which may increase costs.

Various embodiments of the present application are directed a memory layout for reduced line loading. In some embodiments, a memory device comprises an array of bit cells, a first conductive line, a second conductive line, and a plurality of conductive bridges. The first and second conductive lines may, for example, be source lines or some other conductive lines. The array of bit cells comprises a plurality of rows and a plurality of columns, and the plurality of columns comprise a first column and a second column. The first conductive line extends along the first column and is electrically coupled to bit cells in the first column. The second conductive line extends along the second column and is electrically coupled to bit cells in the second column. The conductive bridges extend from the first conductive line to the second conductive line and electrically couple the first and second conductive lines together.

By electrically coupling the first and second conductive lines together, the first and second conductive lines define a composite line with an effective width greater than (e.g., about double) individual widths of the first or second conductive lines. The increased width, in turn, reduces resistance and loading along the composite line, such that the voltage drop along the composite line is low. As a result of the low voltage drop, the minimum read and write voltages are low and dynamic power consumption is low. Further, the memory device may have a single large bank of bit cells, instead of multiple small banks of bit cells, whereby memory density may be high and costs may be low.

With reference to FIG. 1, a block diagram 100 of some embodiments of a memory device with a memory layout for reduced line loading is provided. The memory device may, for example, be an RRAM memory device, a magnetoresistive random-access memory (MRAM) memory device, a ferroelectric random-access memory (FeRAM), or some other suitable type of memory device. The memory device comprises a plurality of bit cells 102. For ease of illustration, only some of the bit cells 102 are labeled 102.

The bit cells 102 are in M columns and N rows to define an array 104, where M and N are integers greater than zero. For clarity, the columns are labeled $C_1$ to $C_M$ and the rows are labeled $R_1$ to $R_N$. Additionally, the bit cells 102 have internal data states representing bits of data. In some embodiments in which the memory device is an RRAM memory device, the bit cells 102 have individual metal oxide elements with variable resistances that define the internal data states. For example, a low resistance state of a metal oxide element may represent a binary "1", and a high resistance state of a metal oxide element may represent a binary "0", or vice versa. The bit cells 102 may, for example, be one-transistor two-resistor (1T1R) bit cells, two-transistor one-resistor (2T1R) bit cells, one-transistor one-capacitor (1T1C) bit cells, two-transistor one-capacitor (2T1C) bit cells, or some other suitable type of bit cell.

A set of word lines (not shown) facilitate selection of the bit cells 102 on a row-by-row basis, whereas a set of bit lines 106 and a set of source lines 108 facilitate reading from and/or writing to selected bit cells on a column-by-column basis. For ease of illustration, only some of the bit lines 106 are labeled 106 and only some of the source lines 108 are labeled 108. The bit lines 106 extend laterally along corresponding columns of the array 104, from a first side of the array 104 to a second side of the array 104 that is opposite the first side. Further, the bit lines 106 electrically couple with bit cells in the corresponding columns. For clarity, the bit lines 106 are labeled $BL_1$ to $BL_M$, where M is the number of columns (see above). In some embodiments, the bit lines 106 correspond to the columns with a one-to-one correspondence. For example, bit line $BL_1$ may correspond to column $C_1$, bit line $BL_2$ may correspond to column $C_2$, bit line $BL_3$ may correspond to column $C_3$, and so on.

The columns of the array 104 are grouped into pairs of neighboring columns, and the source lines 108 extend laterally along corresponding pairs of neighboring columns, from the first side of the array 104 to the second side of the array 104. Further, the source lines 108 electrically couple with bit cells in the corresponding pairs of neighboring columns. For clarity, the source lines 108 are labeled $SL_1$ to $SL_X$, where X is an integer representing the number of pairs of neighboring columns. In some embodiments, the source lines 108 correspond to the neighboring pairs of columns with a one-to-one correspondence. For example, column $C_1$ and column $C_2$ may be paired and may correspond to source line $SL_1$, column $C_3$ and column $C_4$ may be paired and may correspond to source line $SL_2$, and so on.

A plurality of conductive bridges 110 interconnect the source lines 108 to reduce line loading on the source lines 108. The conductive bridges 110 are spaced along the columns and each electrically couple two or more source lines together. By electrically coupling two source lines together, the two source lines define a composite source line with an effective width greater than (e.g., about double) individual widths of the two source lines. The increased width, in turn, reduces resistance and loading along the composite source line, such that the voltage drop along the composite source line is low. As a result of the low voltage drop, the minimum read and write voltages are low and dynamic power consumption is low. Further, the memory device may have a single large bank of bit cells, instead of multiple small banks of bit cells, whereby memory density may be high and costs may be low.

In some embodiments, the conductive bridges 110 are evenly spaced along the columns and/or are laterally elongated in parallel. In some embodiments, the conductive bridges 110 are laterally elongated perpendicular and/or transverse to the source lines 108. In some embodiments, the source lines 108 are grouped into pairs of neighboring source lines and the conductive bridges 110 electrically couple and/or electrically short the neighboring source lines in each pair. For example, source line $SL_1$ and source line $SL_2$ may be paired and electrically coupled together. In some embodiments, the conductive bridges 110 are integrated and/or continuous with the source lines 108. In some embodiments, the conductive bridges 110 are or comprise copper, aluminum copper, aluminum, some other suitable metal, some other suitable conductive material(s), or any combination of the foregoing.

In some embodiments, the conductive bridges 110, the source lines 108, the bit lines 106, or any combination of the foregoing are defined by metal layers of a back-end-of-line (BEOL) interconnect structure. For example, the conductive bridges 110 and the source lines 108 may be defined in metal 1 of a BEOL interconnect structure, and/or the bit lines 106 may be defined in metal 3 or 4 of the BEOL interconnected structure.

Figure 2A:
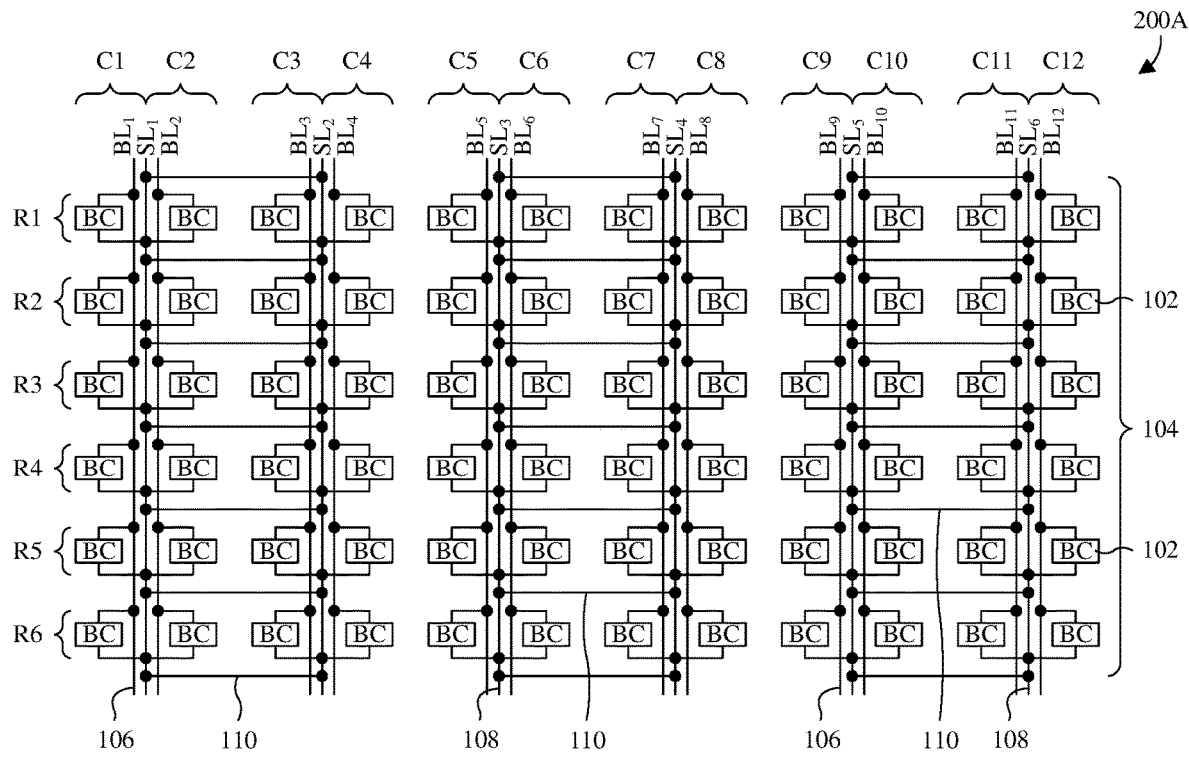
Figure 2B:
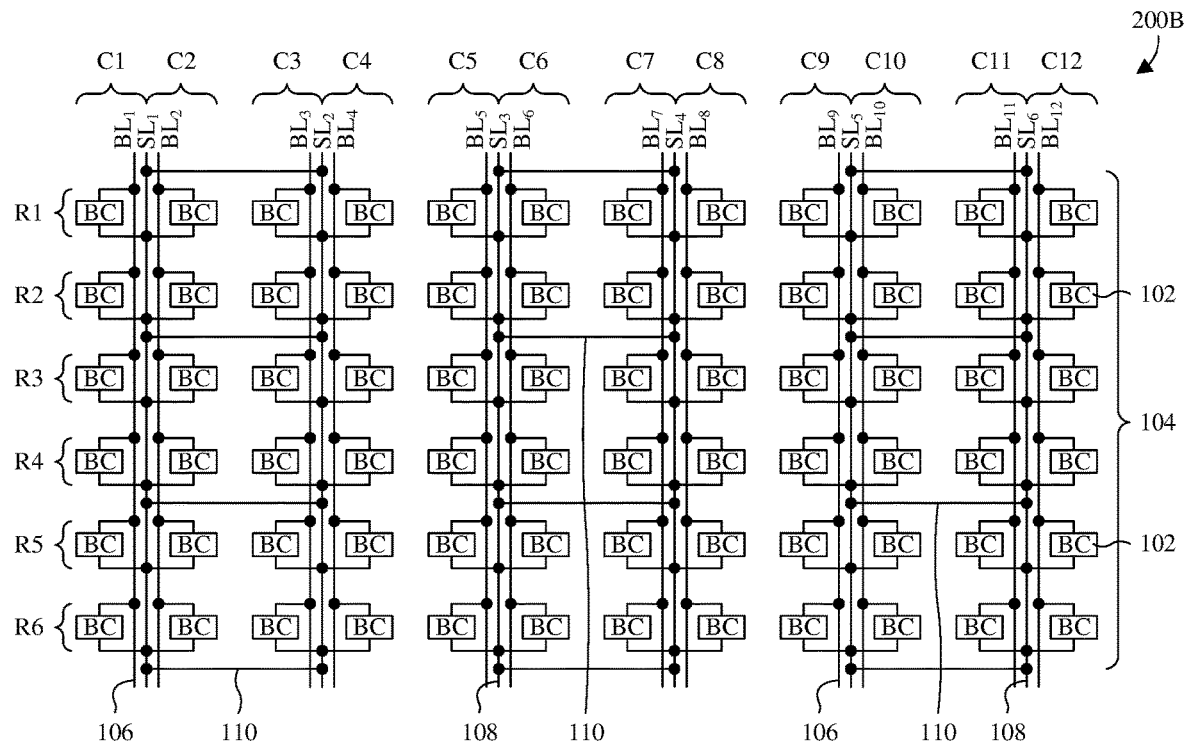
Figure 2C:
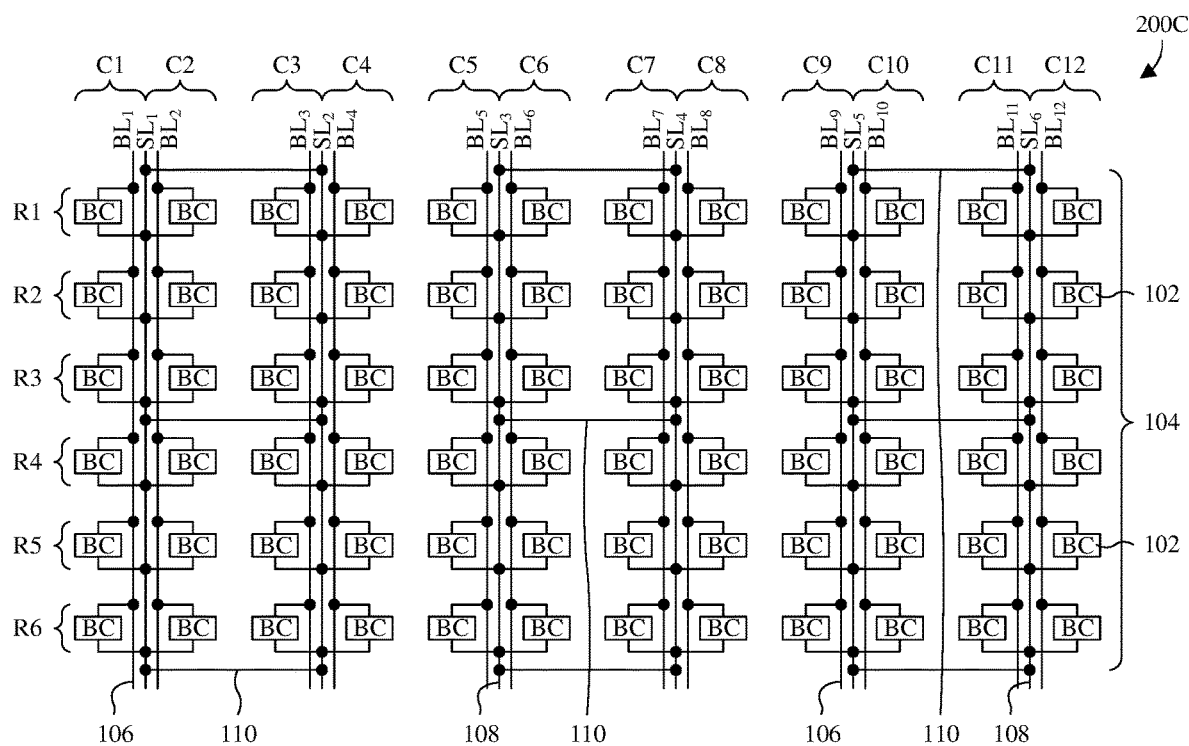
Figure 2D:
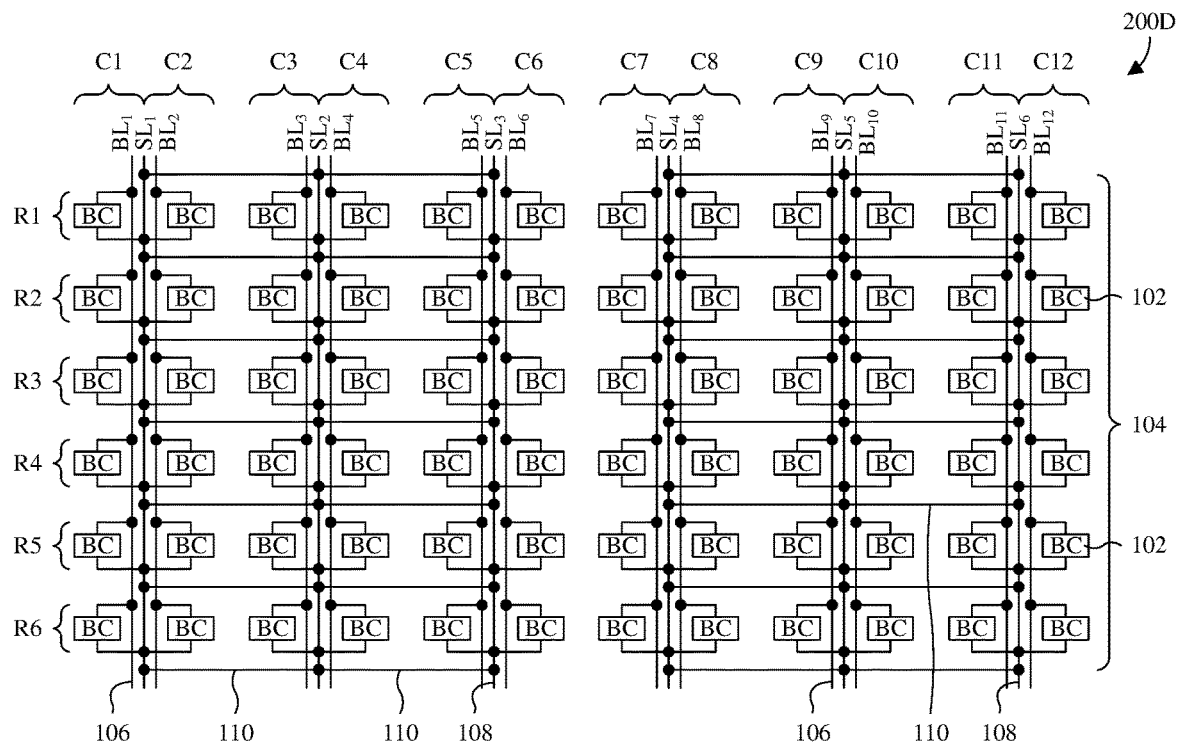
Figure 2E:
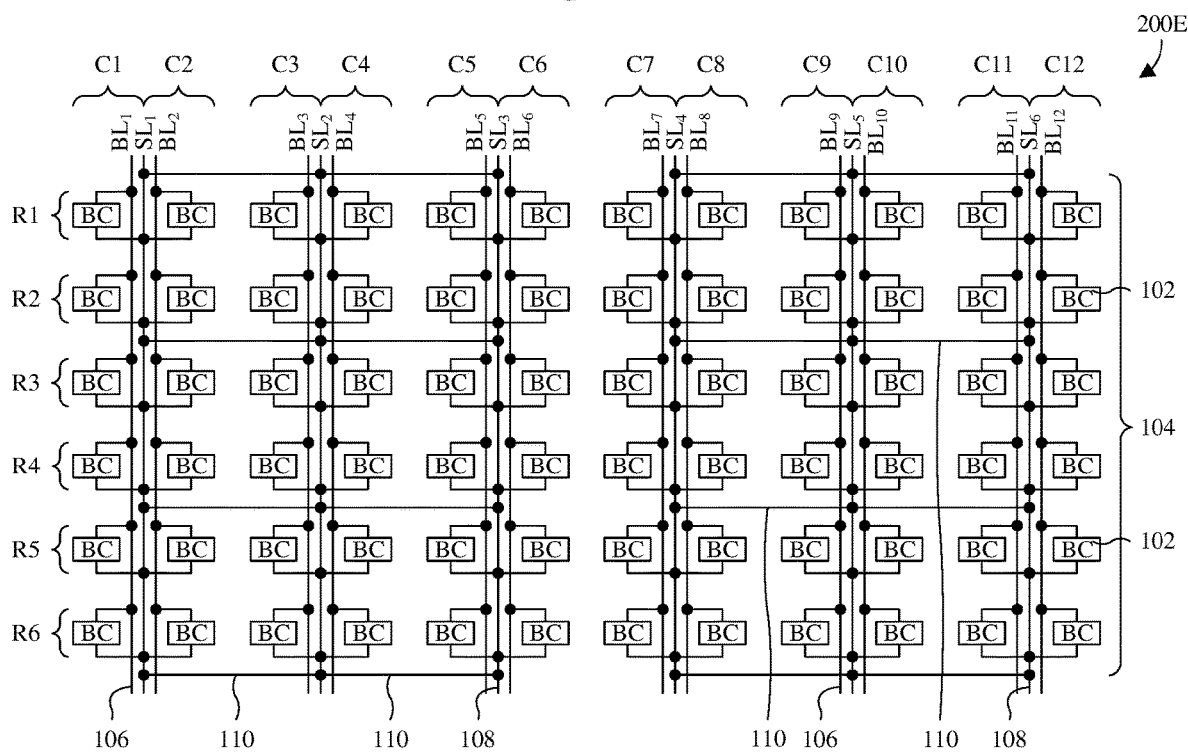
Figure 2F:
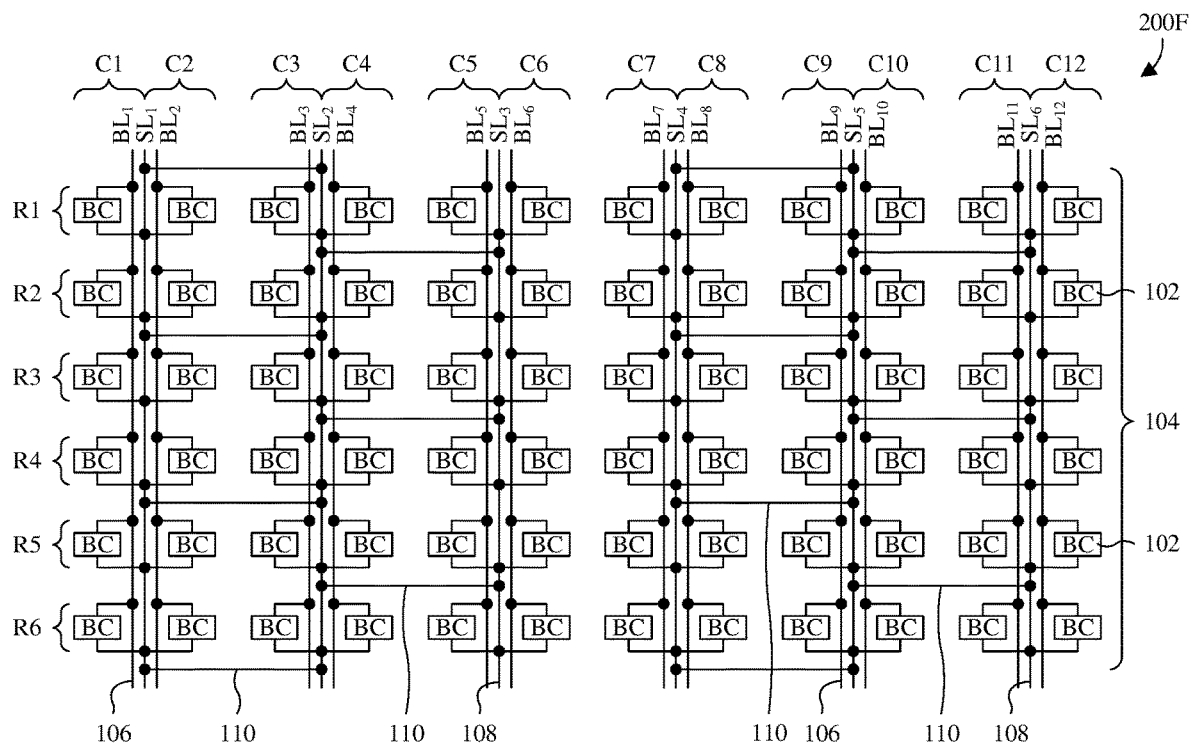
Figure 2G:
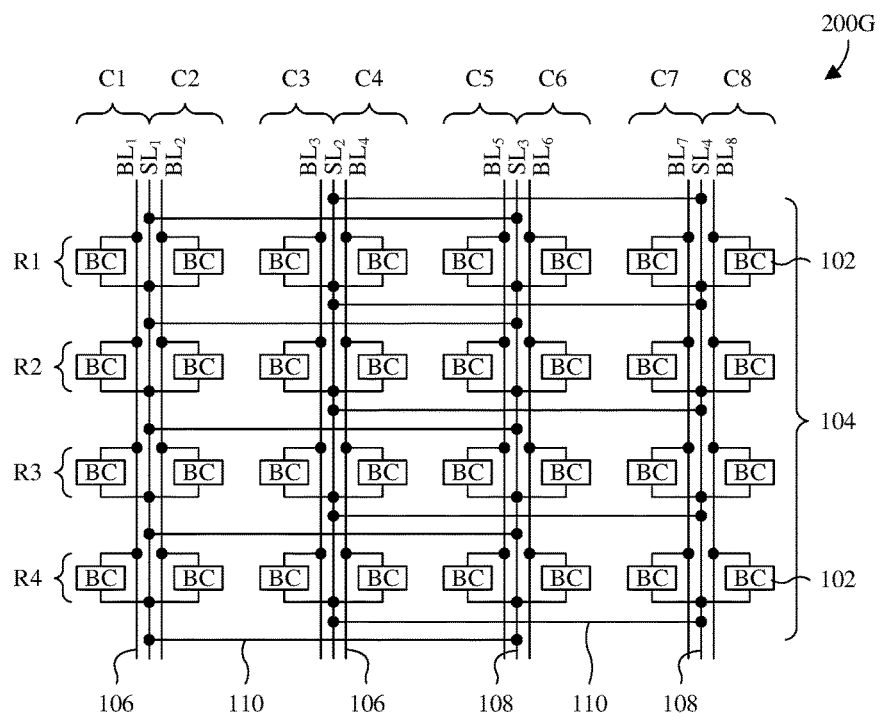

With reference to FIGS. 2A-2H, block diagrams 200A-200H of various embodiments of the memory device of FIG. 1 are provided with different configurations for the conductive bridges 110. FIGS. 2A-2F illustrate the memory device with at least 6 rows and at least 12 columns, whereas FIGS. 2G and 2H illustrate the memory device with at least 4 rows and at least 8 columns. However, these sizes should not be construed as limiting. FIGS. 2A-2F may have more or less rows and/or more or less columns in other embodiments. Similarly, FIGS. 2G and 2H may have more or less rows and/or more or less columns in other embodiments.

As illustrated by the block diagram 200A of FIG. 2A, the source lines 108 are grouped into neighboring pairs, which are non-overlapping. For example, source line $SL_1$ and source $SL_2$ may be grouped into a neighboring pair. Further, the conductive bridges 110 each correspond to one of the neighboring pairs of source lines and each electrically couples source lines in the corresponding neighboring pair. In some embodiments, the correspondence between the conductive bridges 110 and the neighboring pairs is many-to-one.

Also illustrated by the block diagram 200A of FIG. 2A, the conductive bridges 110 are evenly spaced along the columns and have a one-row pitch. Therefore, two conductive bridges neighboring in the same column may, for example, be separated by a single row of bit cells.

As illustrated by the block diagram 200B of FIG. 2B, a variant of FIG. 2A is provided in which the conductive bridges 110 have a two-row pitch. Therefore, two conductive bridges neighboring in the same column may, for example, be separated by two rows of bit cells.

As illustrated by the block diagram 200C of FIG. 2C, a variant of FIG. 2A is provided in which the conductive bridges 110 have a three-row pitch. Therefore, two conductive bridges neighboring in the same column may, for example, be separated by three rows of bit cells. Notwithstanding that FIGS. 2A-2C illustrate the conductive bridges 110 with pitches of one, two, and three rows, other pitches are amenable.

As illustrated by the block diagram 200D of FIG. 2D, the source lines 108 are grouped into groups of three, where the groups are non-overlapping and each group comprises three neighboring source lines. For example, source line $SL_1$, source $SL_2$, and source $SL_3$ may be grouped. Further, the conductive bridges 110 each correspond to one of the groups and each electrically couples source lines in the corresponding group. In some embodiments, the correspondence between the conductive bridges 110 and the groups is many-to-one.

Also illustrated by the block diagram 200D of FIG. 2D, the conductive bridges 110 are evenly spaced along the columns and have a one-row pitch.

As illustrated by the block diagram 200E of FIG. 2E, a variant of FIG. 2D is provided in which the conductive bridges 110 have a two-row pitch. Notwithstanding that FIGS. 2D and 2E illustrate the conductive bridges 110 with pitches of one and two rows, three-row pitches, four-row pitches, and other pitches are amenable.

As illustrated by the block diagram 200F of FIG. 2F, the source lines 108 are grouped into groups of three, where the groups are non-overlapping and each group comprises three neighboring source lines. For example, source line $SL_1$, source $SL_2$, and source $SL_3$ may be grouped. Further, the conductive bridges 110 each correspond to one of the groups and each electrically couples two source lines in the corresponding group. At each of the groups, the conductive bridges for the group alternate between electrically coupling the first two source lines of the group and the second two source lines of the group. For example, at a group made up of source line $SL_1$, source $SL_2$, and source $SL_3$, the conductive bridges corresponding to the group may alternate between electrically coupling source line $SL_1$ and source line $SL_2$ and electrically coupling source line $SL_2$ and source line $SL_3$. In some embodiments, the correspondence between the conductive bridges 110 and the groups is many-to-one.

Also illustrated by the block diagram 200F of FIG. 2F, the conductive bridges 110 are evenly spaced, albeit staggered, along the columns and have a one-row pitch. Notwithstanding that FIG. 2F illustrates the conductive bridges 110 with a one-row pitch, two-row pitches, three-row pitches, and other pitches are amenable.

As illustrated by the block diagram 200G of FIG. 2G, the source lines 108 are grouped into pairs, such that the pairs are non-overlapping and the source lines of each pair are separated by a single source line. For example, source line $SL_1$ and source line $SL_3$ may be paired since source lines $SL_1$, $SL_3$ are separated by source line $SL_2$. As another example, source line $SL_2$ and source line $SL_4$ may be paired since source lines $SL_2$, $SL_4$ are separated by source line $SL_3$. Further, the conductive bridges 110 each corresponds to one of the pairs of source lines and each electrically couples source lines in the corresponding neighboring pair. In some embodiments, the correspondence between the conductive bridges 110 and the pairs is many-to-one.

Also illustrated by the block diagram 200G of FIG. 2G, the conductive bridges 110 are evenly spaced within corresponding columns by a one-row pitch. Notwithstanding that FIG. 2G illustrates the conductive bridges 110 with a one-row pitch, two-row pitches, three-row pitches, and other pitches are amenable.

As illustrated by the block diagram 200H of FIG. 2H, the source lines 108 are grouped into groups of four, where the groups are non-overlapping and each group comprises four neighboring source lines. For example, source line $SL_1$, source line $SL_2$, source line $SL_3$, and source line $SL_4$ may be grouped. Note that only one group has been illustrated. Further, the conductive bridges 110 each correspond to one of the groups and each electrically couples two source lines in the corresponding group. At each of the groups, the conductive bridges for the group alternate between electrically coupling the first and third source lines of the group and the second and fourth source lines of the group. For example, at a group made up of source line $SL_1$, source line $SL_2$, source line $SL_3$, and source line $SL_4$, conductive bridges in the group may alternate between electrically coupling source line $SL_1$ and source line $SL_3$ and electrically coupling source line $SL_2$ and source line $SL_4$. In some embodiments, the correspondence between the conductive bridges 110 and the groups is many-to-one.

Also illustrated by the block diagram 200H of FIG. 2H, the conductive bridges 110 are evenly spaced, albeit staggered, along the columns and have a one-row pitch. Notwithstanding that FIG. 2H illustrates the conductive bridges 110 with a one-row pitch, two-row pitches, three-row pitches, and other pitches are amenable.

With reference to FIG. 3A, a block diagram 300A of some embodiments of a bit cell 102 in any one of FIGS. 1 and 2A-2H is provided. The bit cell 102 comprises a memory structure 302 and an access transistor 304. The memory structure 302 and the access transistor 304 are electrically coupled in series from a bit line BL to a source line SL, and the access transistor 304 is gated by a word line WL. The memory structure 302 is configured to store a bit of data and may, for example, be an RRAM structure, an MRAM structure, or some other suitable memory structure. The access transistor 304 may, for example, be a metal-oxide-semiconductor field-effect transistor (MOSFET), some other suitable insulated-gate field-effect transistor (IGFET), or some other suitable transistor.

With reference to FIG. 3B, a block diagram 300B of some alternative embodiments of the bit cell 102 of FIG. 3A is provided in which the bit cell 102 further comprises a second access transistor 306. The access transistor 304 (also known as the first access transistor 304) and the second access transistor 306 are electrically coupled in parallel from the memory structure 302 to the source line SL. Further, the first and second access transistors 304, 306 are respectively gated by the word line WL (also known as the first word line WL) and a second word line WL'. The second access transistor 306 may, for example, be a MOSFET, an IGFET, or some other suitable transistor.

Figure 4A:
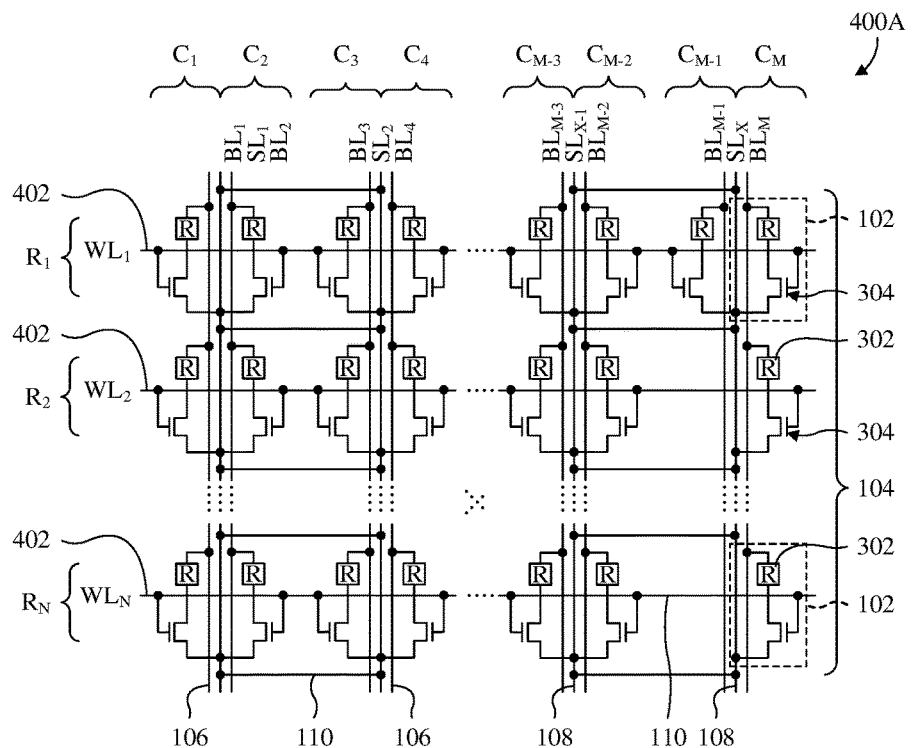
FIGS. 4A and 4B illustrate block diagrams of various embodiments of the memory device of FIG. 1 respectively with the bit cells of FIGS. 3A and 3B.
Figure 4B:
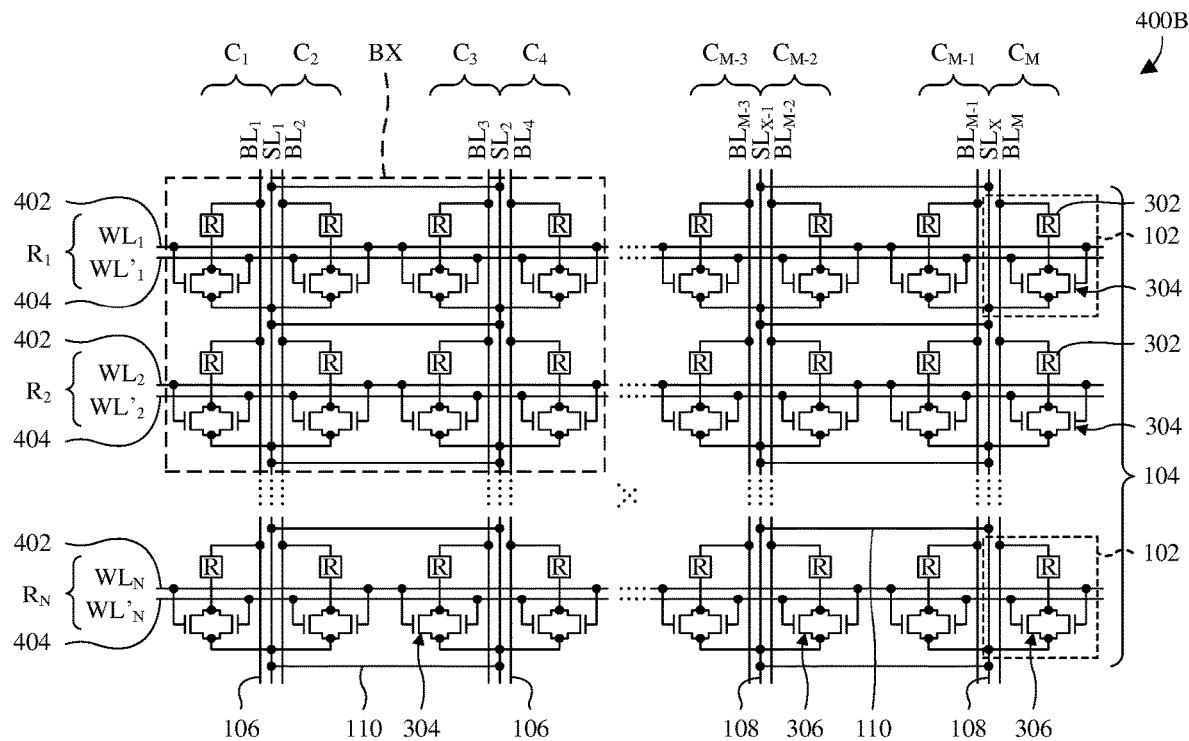

With reference to FIGS. 4A and 4B, block diagrams 400A, 400B of various embodiments of the memory device of FIG. 1 are provided respectively with embodiments of the bit cell 102 in FIGS. 3A and 3B. Also note that row $R_3$ is not specifically shown in FIGS. 4A and 4B to improve the compactness of FIGS. 4A and 4B.

As illustrated by the block diagram 400A of FIG. 4A, each of the bit cells 102 is as illustrated and described with regard to FIG. 3A. For ease of illustration, only some of the bit cells 102 are labeled 102. Further, the memory structure 302 and the access transistor 304 are only labeled for some of the bit cells 102.

A set of word lines 402 facilitates selection of the bit cells 102 on a row-by-row basis, whereas the set of bit lines 106 and the set of source lines 108 facilitate reading from and/or writing to selected bit cells on a column-by-column basis. For ease of illustration, only some of the bit lines 106 are labeled 106 and only some of the source lines 108 are labeled 108. The word lines 402 extend laterally along corresponding rows of the array 104. Further, the word lines 402 electrically couple with bit cells in the corresponding rows. For clarity, the word lines 402 are labeled $WL_1$ to $WL_N$, where N is the number of rows. In some embodiments, the word lines 402 correspond to the rows with a one-to-one correspondence. For example, word line $WL_1$ may correspond to row $R_1$, word line $WL_2$ may correspond to row $R_2$, and so on.

As illustrated by the block diagram 400B of FIG. 4B, a variant of FIG. 4A is provided in which each of the bit cells 102 is as illustrated and described with regard to FIG. 3B. For ease of illustration, the memory structure 302, the first access transistor 304, and the second access transistor 306 are only labeled for some of the bit cells 102.

The set of word lines 402 (also known as the set of first word lines 402) and a set of second word lines 404 facilitate selection of the bit cells 102 on a row-by-row basis. The second word lines 404 extend laterally along corresponding rows of the array 104. Further, the second word lines 404 electrically couple with bit cells in the corresponding rows. For clarity, the second word lines 404 are labeled $WL'_1$ to $WL'_N$, where N is the number of rows. In some embodiments, the second word lines 404 correspond to the rows with a one-to-one correspondence. For example, second word line $WL'_1$ may correspond to row $R_1$, second word line WL'2 may correspond to row $R_2$, and so on.

While FIGS. 4A and 4B illustrate bit cell embodiments in FIGS. 3A and 3B using the memory device of FIG. 1, it is to be appreciated that the bit cell embodiments may be used in any one of FIGS. 2A-2G in other embodiments. For example, each of the bit cells 102 in FIG. 2A may be as illustrated with regard to FIG. 3A or FIG. 3B. As another example, each of the bit cells 102 in FIG. 2E may be as illustrated with regard to FIG. 3A or FIG. 3B.

Figure 5A:
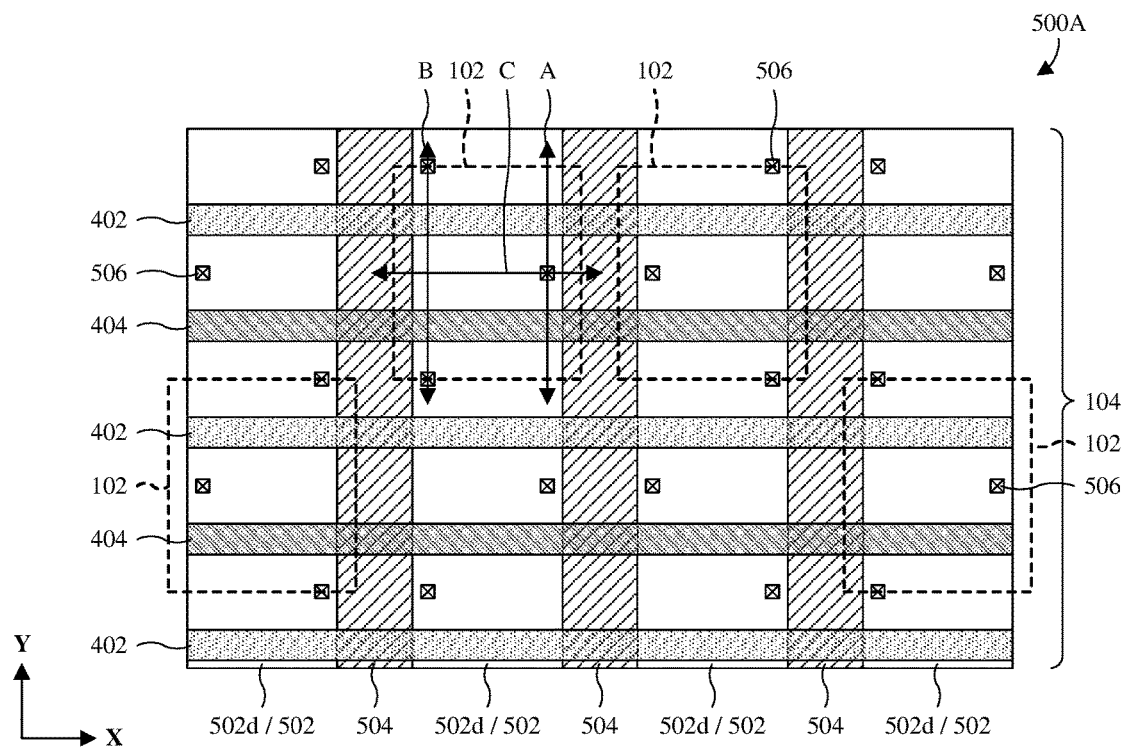
FIGS. 5A-5C illustrate various top layouts of some embodiments of a memory device portion of FIG. 4B.
Figure 5B:
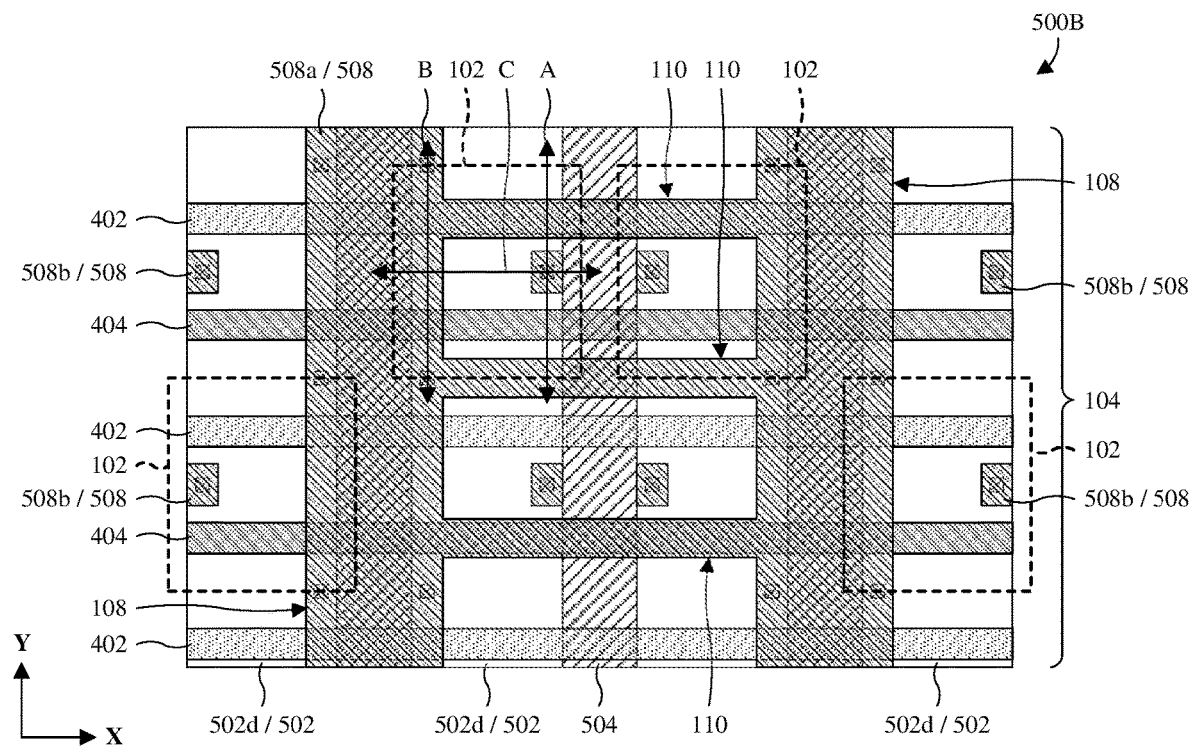
Figure 5C:
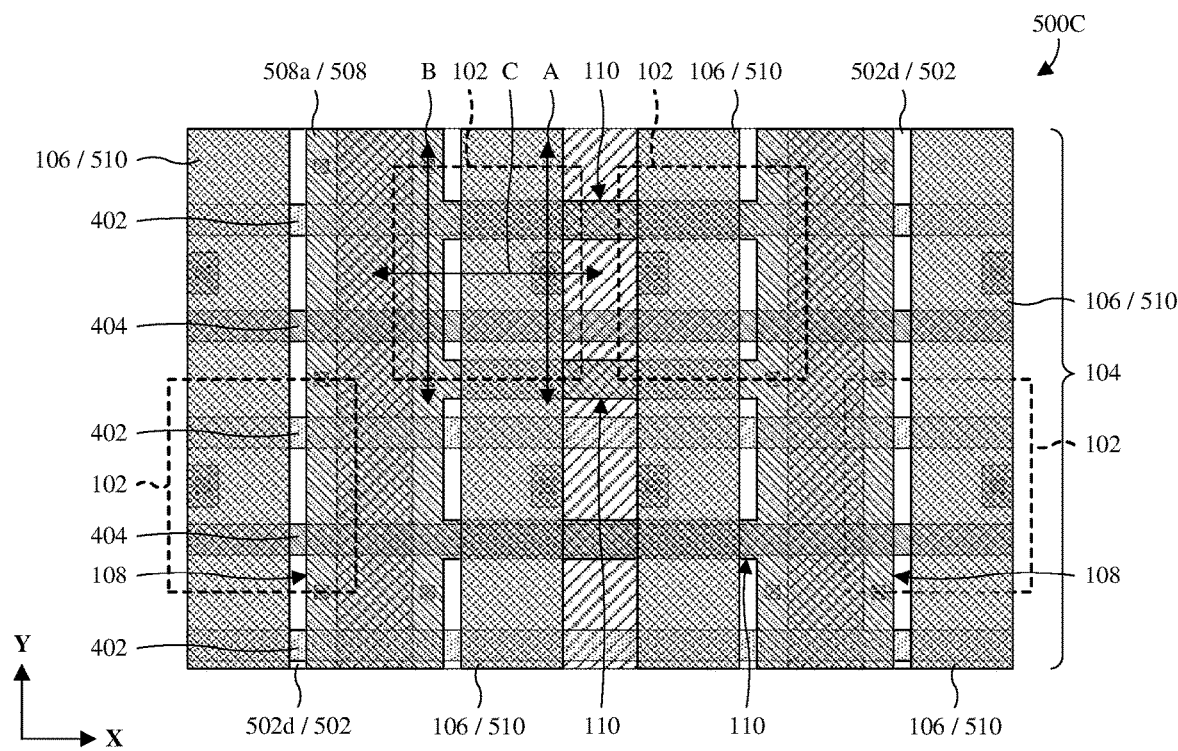

With reference to FIGS. 5A-5C, various top layouts 500A-500C of some embodiments of a memory device portion of FIG. 4B is provided. The top layouts 500A-500C may, for example, be taken within box BX in FIG. 4B, but other locations are amenable. The top layout 500A of FIG. 5A is limited to features in the front end of line (FEOL) and contact vias, such that wires and inter-wire vias are not shown. The top layouts 500B, 500C of FIGS. 5B and 5C include the features of FIG. 5A, and further include wires in the BEOL.

As illustrated by the top layout 500A of FIG. 5A, the bit cells 102 are respectively on device regions 502d of a semiconductor substrate 502. For ease of illustration, only some of the bit cells 102 are identified. The device regions 502d accommodate source/drain regions (not shown) of the first and second access transistors 304, 306 in FIG. 4B and are separated and demarcated by isolation structures 504. The device regions 502d and the isolation structures 504 extend laterally in a Y direction. The Y direction may, for example, correspond to columns in the array 104 of bit cells. See, for example, columns $C_1$-$C_4$ in FIG. 4B. In some embodiments, the device regions 502d and the isolation structures 504 are line shaped and/or are substantially parallel to each other. Other shapes are, however, amenable. The semiconductor substrate 502 may, for example, be a bulk silicon substrate, some other suitable bulk semiconductor substrate, a silicon-on-insulator (SOI) substrate, or some other suitable semiconductor substrate. The isolation structures 504 may, for example, be shallow trench isolation (STI) structures, deep trench isolation (DTI) structure, or some other suitable isolation structure.

The first and second word lines 402, 404 extend laterally in an X direction across the device regions 502d and the isolation structure 504. The X direction may, for example, correspond to rows in the array 104 of bit cells. See, for example, rows $R_1$-$R_N$ in FIG. 4B. In some embodiments, the first and second word lines 402, 404 are line shaped and/or are substantially parallel to each other. Other shapes are, however, amenable. The first word lines 402 define gate electrodes of the first access transistors 304 in FIG. 4B and the second word lines 404 define gate electrodes of the second access transistors 306 in FIG. 4B. The first and second word lines 402, 404 may, for example, be or comprise doped polysilicon, metal, some other suitable conductive material(s), or any combination of the foregoing.

Contact vias 506 are on the device regions 502d and electrically couple components of the bit cells 102 to overlying structure when viewed in cross section. For ease of illustration, only some of the contact vias 506 are labeled 506. Such components may, for example, include the first access transistors 304 (not shown) in FIG. 4B and the second access transistors 306 (not shown) in FIG. 4B. The contact vias 506 may, for example, be or comprise tungsten, some other suitable metal or conductive material(s), or any combination of the foregoing.

As illustrated by the top layout 500B of FIG. 5B, the features of FIG. 5A are included along with a plurality of lower-level wires 508. For ease of illustration, only some of the lower-level wires 508 are labeled 508. When viewed in cross section, the lower-level wires 508 have a common elevation above the semiconductor substrate 502 and adjoin or otherwise neighbor the contact vias 506 (see FIG. 5A). For example, the lower-level wires 508 may correspond to metal 1 in a BEOL interconnect structure. The lower-level wires 508 include a composite source line 508a that comprises the source lines 108 and the conductive bridges 110. The composite source line 508a has a ladder-shaped layout in which legs of the ladder-shaped layout and rungs of the ladder-shaped layout are respectively defined by the source lines 108 and the conductive bridges 110. Other layouts are, however, amenable in other embodiments.

The source lines 108 extend laterally in the Y direction, respectively on the isolation structures 504 (see FIG. 5A), and the conductive bridges 110 extend laterally in the X direction. In some embodiments, the source lines 108 are line shaped and/or are substantially parallel to each other. Similarly, in some embodiments, the conductive bridges 110 are line shaped and/or substantially parallel to each other. Other shapes are, however, amenable for the source lines 108 and/or the conductive bridges 110. In some embodiments, the conductive bridges 110 are evenly spaced in the Y direction. The source lines 108 electrically couple to the first and second access transistors 304, 306 (not shown) in FIG. 4B by way of the contact vias 506 (see FIG. 5A).

As discussed above, the conductive bridges 110 each electrically couple two or more source lines together to reduce line loading on the source lines. By electrically coupling two source lines together, the two source lines define a composite source line with an effective width greater than (e.g., about double) individual widths of the two source lines. The increased width, in turn, reduces resistance and loading along the composite source line, such that the voltage drop along the composite source line is low. As a result of the low voltage drop, the minimum read and write voltages are low and dynamic power consumption is low.

The lower-level wires 508 further include lower-level islands 508b. For ease of illustration, only some of the lower-level islands 508b are labeled 508b. Similar to the source lines 108, the lower-level islands 508b electrically couple to the first and second access transistors 304, 306 (not shown) in FIG. 4B by way of the contact vias 506 (see FIG. 5A). As seen hereafter, the lower-level islands 508b serve as bases upon which to form memory structures (not shown) and through which the memory structures are electrically coupled to the first and second access transistors 304, 306 in FIG. 4B.

As illustrated by the top layout 500C of FIG. 5C, the features of FIG. 5B are included along with a plurality of upper-level wires 510. When viewed in cross section, the upper-level wires 510 have a common elevation above the semiconductor substrate 502 and overlie the lower-level wires 508. The upper-level wires 510 may, for example, correspond to metal 3 or metal 4 in a BEOL interconnect structure. The upper-level wires 510 include the bit lines 106. The bit lines 106 respectively overlie and electrically couple to the memory structures 302 (not shown) in FIG. 4B when viewed in cross section. Further, the bit lines 106 extend laterally in the Y direction. In some embodiments, the bit lines 106 are line shaped and/or are substantially parallel to each other. Other shapes are, however, amenable for the bit lines 106.

While the conductive bridges 110 and the source lines 108 are illustrated as being at a common elevation above the semiconductor substrate 502 when viewed in cross section, the conductive bridges 110 and the source lines 108 may alternatively be at different elevations when viewed in cross section. For example, the conductive bridges 110 may be at metal 2 of a BEOL interconnect structure, and the source lines 108 may be at metal 1 of the BEOL interconnect structure, or vice versa. Further, while the bit cells 102 are illustrated using embodiments in FIG. 3B, the bit cells 102 may alternatively use embodiments in FIG. 3A by at least removing the second word lines 404. Further, while the conductive bridges 110 are illustrated using a conductive bridge configuration in FIG. 4B, the conductive bridges 110 may alternatively use a conductive bridge configuration in any one of FIGS. 1, 2A-2H, and 4A.

Figure 6:
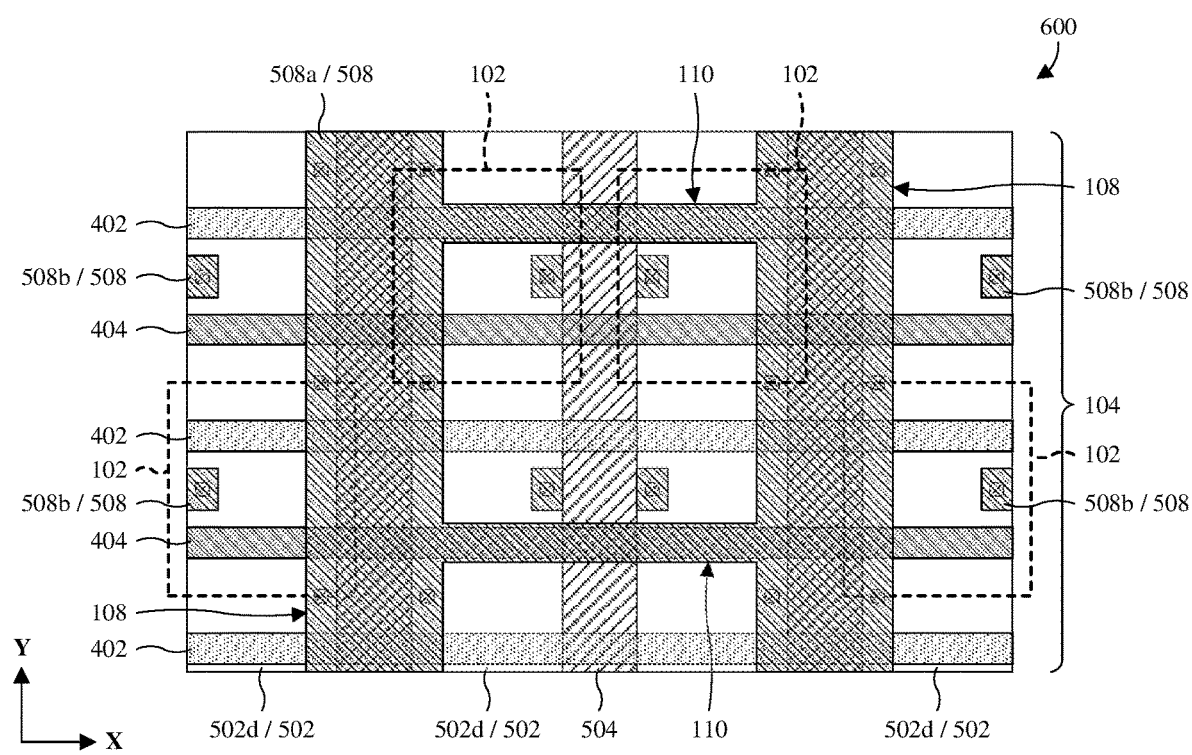
FIG. 6 illustrates a top layout of some alternative embodiments of the memory device portion of FIG. 5B in which conductive bridges have a two-row pitch.

With reference to FIG. 6, a top layout 600 of some alternative embodiments of the memory device portion of FIG. 5B is provided in which the conductive bridges 110 have a two-row pitch instead of a one-row pitch. Therefore, two conductive bridges neighboring in the same column may, for example, be separated by two rows of bit cells. Compare FIG. 2A (which has a one-row pitch) to FIG. 2B (which has a two-row pitch). Having a pitch of two-rows or more for the conductive bridges 110 relaxes design constraints of the lower-level islands 508b and allows the lower-level islands 508b to be larger than with a one-row pitch.

Figure 7A:
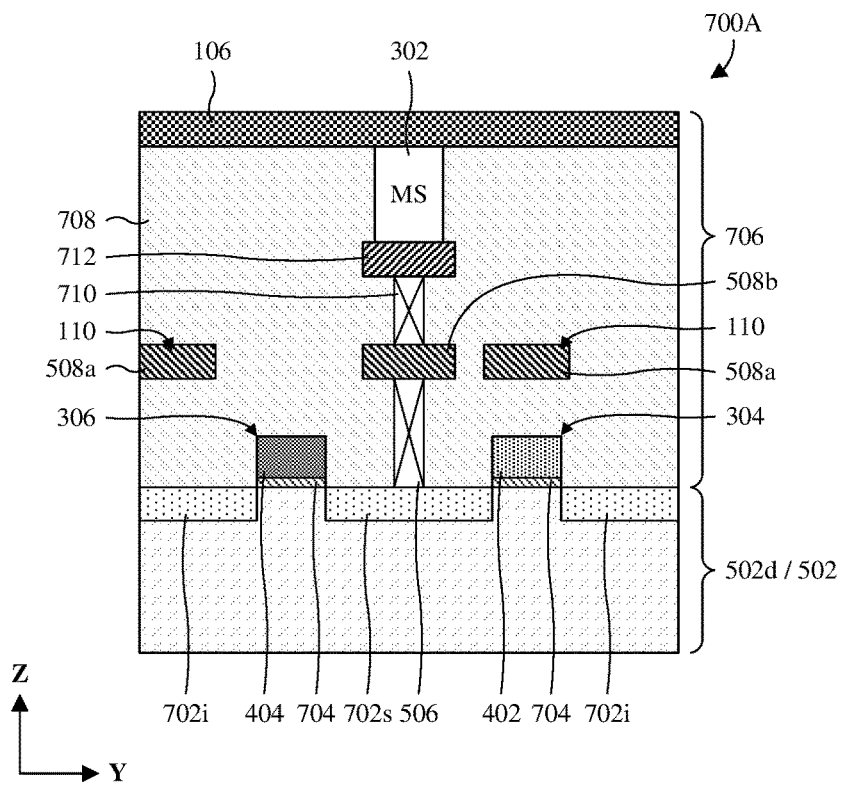
FIGS. 7A-7C illustrate various cross-sectional views of some embodiments of the memory device portion of FIGS. 5A-5C.
Figure 7B:
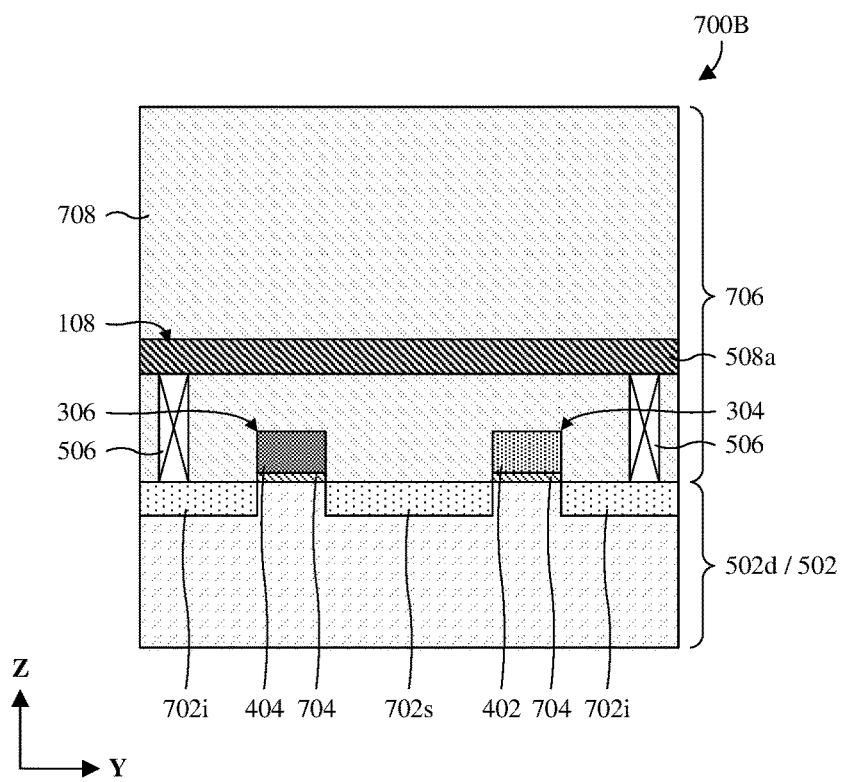
Figure 7C:
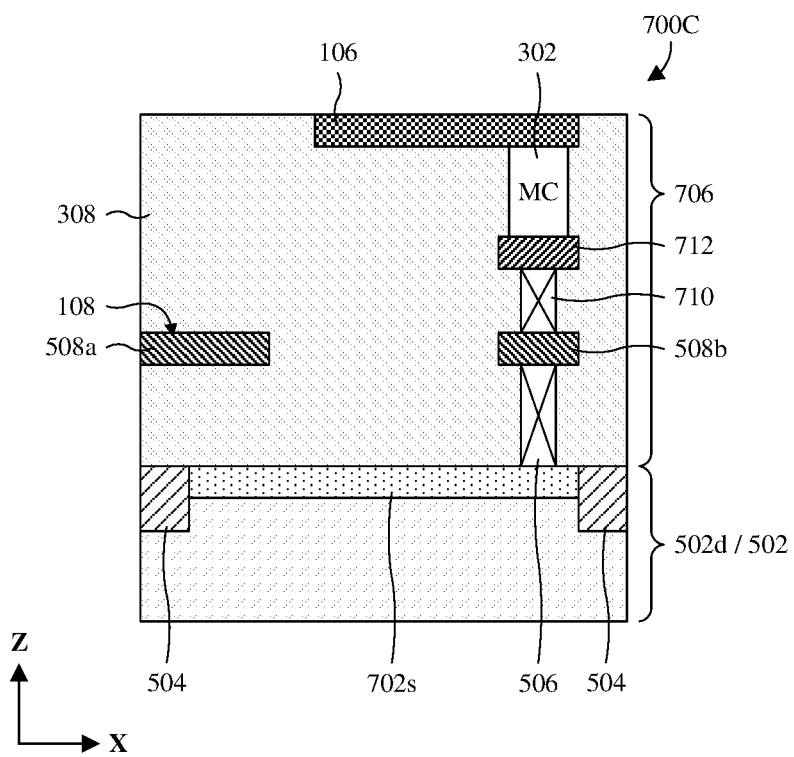

With reference to FIGS. 7A-7C, various cross-sectional views 700A-700C of some embodiments of the memory device portion of FIGS. 5A-5C is provided. The cross-sectional views 700A-700C may, for example, respectively be taken along lines A-C in FIGS. 5A-5C.

As illustrated by the cross-sectional view 700A of FIG. 7A, a first access transistor 304 and a second access transistor 306 are on a semiconductor substrate 502. The first and second access transistors 304, 306 comprise individual source/drain regions 702i and a shared source/drain region 702s. The individual source/drain regions 702i and the shared source/drain region 702s are in the semiconductor substrate 502 and have the same doping type, which is different than the doping type of adjoining portions of the semiconductor substrate 502. Further, the shared source/drain region 702s is between the individual source/drain regions 702i.

A first word line 402 and a second word line 404 respectively define gate electrodes of the first access transistor 304 and the second access transistor 306. As such, when the first word line 402 is appropriately biased, a portion of the semiconductor substrate 502 directly under the first word line 402 may conduct from the shared source/drain region 702s to a corresponding one of the individual source/drain regions 702i. Similarly, when the second word line 404 is appropriately biased, a portion of the semiconductor substrate 502 directly under the second word line 404 may conduct from the shared source/drain region 702s to a corresponding one of the individual source/drain regions 702i. The first and second word lines 402, 404 are spaced from the semiconductor substrate 502 by corresponding word line dielectric layers 704 and may be or comprise, for example, doped polysilicon, metal, some other suitable conductive material(s), or a combination of the foregoing. The word line dielectric layers 704 may, for example, be silicon oxide and/or some other suitable dielectric(s).

An interconnect structure 706 overlies the first and second access transistors 304, 306. The interconnect structure 706 comprises an interconnect dielectric layer 708, and further comprises a plurality of vias and a plurality of wires. The interconnect dielectric layer 708 may, for example, be or comprise silicon oxide, a low κ dielectric, some other suitable dielectric(s), or any combination of the foregoing. A low κ dielectric may be, for example, a dielectric with a dielectric constant κ less than about 3.9, 3, 2, or 1. The plurality of vias comprises a contact via 506 and an inter-wire via 710. The plurality of wires comprises a composite source line 508a, a lower-level island 508b, a mid-level island 712, and a bit line 106.

The composite source line 508a and the lower-level island 508b are at a first elevation above the semiconductor substrate 502. The composite source line 508a comprises conductive bridges 110 and may, for example, have a ladder-shaped top layout in which rungs of the ladder shape are defined by the conductive bridges 110. An example of the ladder-shaped top layout is in FIG. 5B. Notwithstanding that the composite source line 508a may have a ladder-shaped top layout, other top layouts are amenable. The lower-level island 508b overlies the shared source/drain region 702s and is electrically coupled to the shared source/drain region 702s by the contact via 506. The mid-level island 712 is at a second elevation above the semiconductor substrate 502 and the second elevation is greater than the first elevation. Further, the mid-level island 712 overlies the lower-level island 508b and is electrically coupled to the lower-level island 508b by the inter-wire via 710. The bit line 106 is at a third elevation above the semiconductor substrate 502 and the third elevation is greater than the second elevation.

The vias and the wires are alternatingly stacked in the interconnect dielectric layer 708 to define conductive paths. The contact via 506, the inter-wire via 710, the lower-level island 508b, and the mid-level island 712 define a conductive path from the shared source/drain region 702s to a memory structure 302. Further, the bit line 106 defines a conductive path from the memory structure 302 to a periphery the memory device. As noted above, the memory structure 302 is configured to store a bit of data and may, for example, be an RRAM structure, an MRAM structure, or some other suitable memory structure.

As illustrated by the cross-sectional view 700B of FIG. 7B, the composite source line 508a further comprises a source line 108 electrically coupled to the individual source/drain regions 702i by additional contact vias 506. In embodiments in which the composite source line 508a has a ladder-shaped top layout, a leg of the ladder shape may be defined by the source line 108. As above, even though the composite source line 508a may have a ladder-shaped top layout, other top layouts are amenable.

As illustrated by the cross-sectional view 700C of FIG. 7C, the shared source/drain region 702s is sandwiched between a pair of isolation structures 504. Further, the contact via 506, the lower-level island 508b, the inter-wire via 710, and the mid-level island 712 define a conductive path from the shared source/drain region 702s to the memory structure 302.

While the cross-sectional views 700A-700C of FIGS. 7A-7C are illustrated using embodiments of the memory device in FIG. 4B, it is to be understood that the cross-sectional views 700A-700C may be used with other embodiments of the memory device. For example, the cross-sectional views 700A-700C may be used with embodiments of the memory device in FIG. 4A by removing second word lines 404 and the second access transistors 306.

With reference to FIGS. 8-12, a series of cross-sectional views 800-1200 of some embodiments of a method for forming a memory device with a layout for reduced line loading is provided. The method may, for example, be employed to form the memory device in any one of FIGS. 1, 2A-2H, 4A, 4B, 5A-5C, 6, and 7A-7C. However, the method is illustrated using some embodiments of the memory device in FIG. 7A. Hence, the cross-sectional views 800-1200 may, for example, be taken along line A in any one of FIGS. 5A-5C. As above, FIGS. 5A-5C may, for example, be taken within box BX in FIG. 4B.

Figure 8:
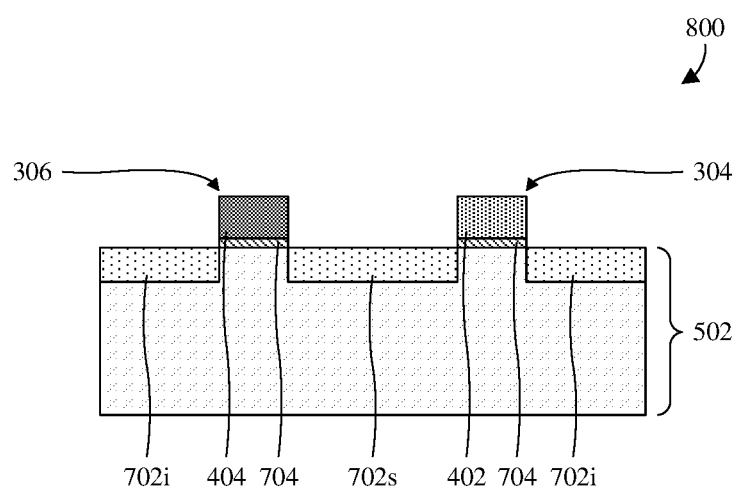
FIGS. 8-12 illustrate a series of cross-sectional views of some embodiments of a method for forming a memory device with a layout for reduced line loading.

As illustrated by the cross-sectional view 800 of FIG. 8, a first access transistor 304 and a second access transistor 306 are formed on a semiconductor substrate 502. The first and second access transistors 304, 306 comprise individual source/drain regions 702i and a shared source/drain region 702s. The individual source/drain regions 702i and the shared source/drain region 702s are in the semiconductor substrate 502 with the shared source/drain region 702s between the individual source/drain regions 702i. The first and second access transistors 304, 306 further comprise gate electrodes and gate dielectric layers. The gate electrodes are respectively defined by a first word line 402 and a second word line 404, and the gate dielectric layers are respectively defined by word line dielectric layers 704. The word line dielectric layers 704 each overlie the semiconductor substrate 502, laterally between the shared source/drain region 702s and a respective one of the individual source/drain regions 702i. Further, the first and second word lines 402, 404 respectively overlie the word line dielectric layers 704.

In some embodiments, a process for forming the first and second access transistors 304, 306 comprises: 1) forming the first and second word lines 402, 404 and the word line dielectric layers 704 on the semiconductor substrate 502; and 2) subsequently forming the individual source/drain regions 702i and the shared source/drain region 702s.

In some embodiments, the first and second word lines 402, 404 and the word line dielectric layers 704 comprises: 1) depositing a dielectric layer covering the semiconductor substrate 502; 2) depositing a conductive layer covering the dielectric layer; and 3) patterning the dielectric layer and the conductive layer respectively into the word line dielectric layers 704 and the first and second word lines 402, 404. The depositing of the dielectric layer may, for example, be performed by chemical vapor deposition (CVD), physical vapor deposition (PVD), thermal oxidation, some other suitable deposition process(es), or any combination of the foregoing. The depositing of the conductive layer may, for example, be performed by CVD, PVD, electroless plating, electroplating, some other suitable deposition process, or any combination of the foregoing. The patterning may, for example, comprise a photolithography/etching process and/or some other suitable patterning process(es).

In some embodiments, the forming of the individual source/drain regions 702i and the shared source/drain region 702s comprises ion implantation in which dopants are implanted into the semiconductor substrate 502 with the first and second word lines 402, 404 in place. In some embodiments, the first and second word lines 402, 404 or hard masks (not shown) on the first and second word lines 402, 404 serve as a mask during the ion implantation. In alternative embodiments, some other doping process(es) is/are performed to form the individual source/drain regions 702i and the shared source/drain region 702s.

Figure 9:
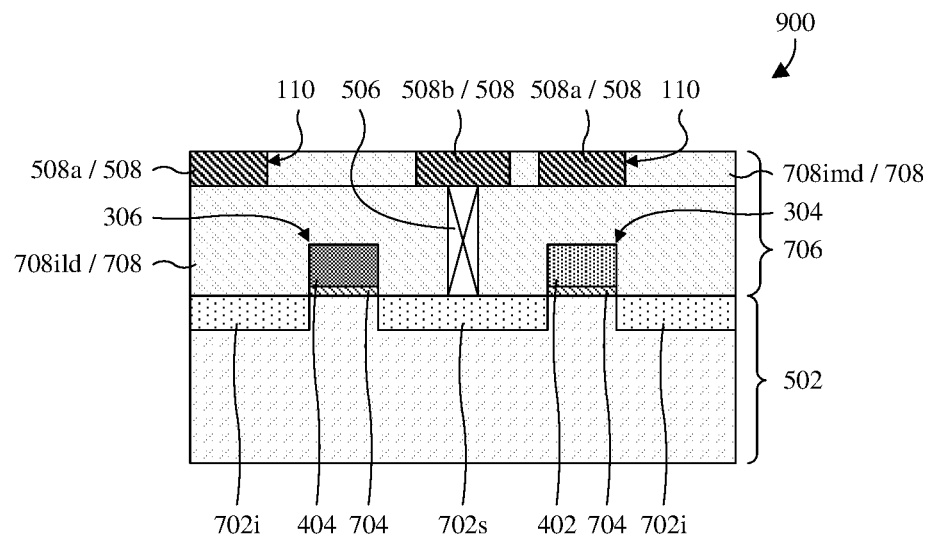

As illustrated by the cross-sectional view 900 of FIG. 9, an interconnect structure 706 is partially formed on the first and second access transistors 304, 306. The interconnect structure 706 comprises an interconnect dielectric layer 708, a contact via 506, and a plurality of lower-level wires 508. The interconnect dielectric layer 708 comprises an interlayer dielectric (ILD) layer 708ild, and further comprises an intermetal dielectric (IMD) layer 708imd overlying the ILD layer 708ild. The contact via 506 is in the ILD layer 708ild and extends through the ILD layer 708ild to the shared source/drain region 702s. The plurality of lower-level wires 508 is in the IMD layer 708imd and comprises a composite source line 508a and a lower-level island 508b. Note that the composite source line 508a is not fully visible within the cross-sectional view 900. For a more complete view, see the top layout 500B of FIG. 5B.

The lower-level island 508b overlies the shared source/drain region 702s and is electrically coupled to the shared source/drain region 702s by the contact via 506. The composite source line 508a comprises conductive bridges 110 and source lines 108 (not shown). The source lines 108 are outside the cross-sectional view 900 and are electrically coupled together by the conductive bridges 110. A first one of the source lines 108 is electrically coupled to the individual source/drain regions 702*i* outside of the cross-sectional view 900 by additional contact vias (not shown). See the two contact vias 506 along line B in FIGS. 5A-5C. A second one of the source lines 108 is electrically coupled to individual source/drain regions (not shown) of another bit cell outside of the cross-sectional view 900 by additional contact vias (not shown). By electrically couples the source lines 108 together, the composite source line 508*a* has an effective width greater than individual widths of the source lines 108, whereby a resistance of the composite source line 508*a* is less than individual resistances of the source lines 108. This reduces line loading and improves power efficiency.

In some embodiments, a process for partially forming the interconnect structure 706 comprises: 1) depositing the ILD layer 708*ild*; 2) forming the contact via 506 in the ILD layer 708*ild*; 3) depositing the IMD layer 708*imd*; and 4) forming the plurality of lower-level wires 508 in the IMD layer 708*imd*. The depositing of the ILD and IMD layers 708*ild*, 708*imd* may, for example, be performed by CVD, PVD, some other suitable deposition process, or any combination of the foregoing. The forming of the contact via 506 and the forming of the lower-level wires 508 may, for example, be performed by a single damascene process or some other suitable process. The single damascene process comprises: 1) patterning a dielectric layer (e.g., the ILD layer 708*ild* or the IMD layer 708*imd*) to form openings with a layout of conductive features being formed (e.g., the contact via 506 or the plurality of lower-level wires 508); 2) depositing a conductive layer filling the openings and covering the dielectric layer; and 3) performing a planarization into the conductive layer until the dielectric layer is reached. The patterning may, for example, be performed by a photolithography/etching process or some other suitable patterning process. The depositing of the conductive layer may, for example, be performed by CVD, PVD, electroless plating, electroplating, some other suitable deposition process, or any combination of the foregoing. The planarization may, for example, be performed by a chemical mechanical polish (CMP) or some other suitable planarization process.

Figure 10:
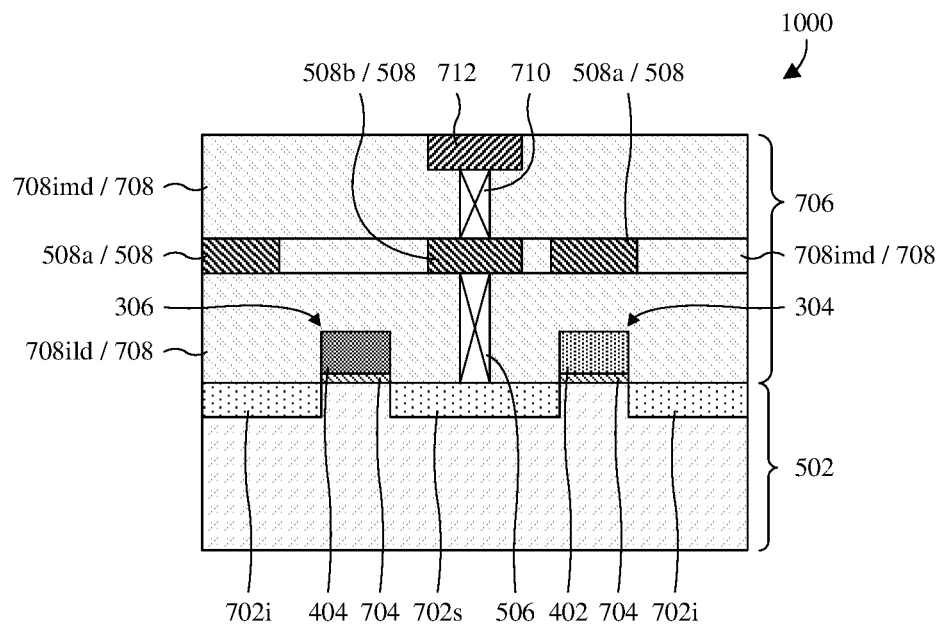

As illustrated by the cross-sectional view 1000 of FIG. 10, the interconnect structure 706 is extended to include an additional IMD layer 708*imd*, a mid-level island 712, and an inter-wire via 710. The additional IMD layer 708*imd* overlies the plurality of lower-level wires 508 and accommodates both the mid-level island 712 and the inter-wire via 710. The mid-level island 712 overlies the lower-level island 508*b* and is electrically coupled to the lower-level island 508*b* by the inter-wire via 710.

In some embodiments, a process for extending the interconnect structure 706 comprises: 1) depositing the additional IMD layer 708*imd*; 2) patterning the additional IMD layer 708*imd* to form openings with a layout for both the mid-level island 712 and the inter-wire via 710; 3) depositing a conductive layer filling the openings and covering the additional IMD layer 708*imd*; and 3) performing a planarization into the conductive layer until the additional IMD layer 708*imd* is reached. The patterning may, for example, be performed by a series of individual patterning processes, each being a photolithography/etching process or some other suitable patterning process. The depositing of the conductive layer may, for example, be performed by CVD, PVD, electroless plating, electroplating, some other suitable deposition process, or any combination of the foregoing. The planarization may, for example, be performed by a CMP or some other suitable planarization process.

While not shown, the extension of the interconnect structure 706 may be omitted in other embodiments, such that the additional IMD layer 708*imd*, the mid-level island 712, and the inter-wire via 710 are omitted. Further, the extension of the interconnect structure 706 may be repeated one or more times in other embodiments, such that the additional IMD layer 708*imd*, the mid-level island 712, and the inter-wire via 710 are repeated one or more times.

Figure 11:
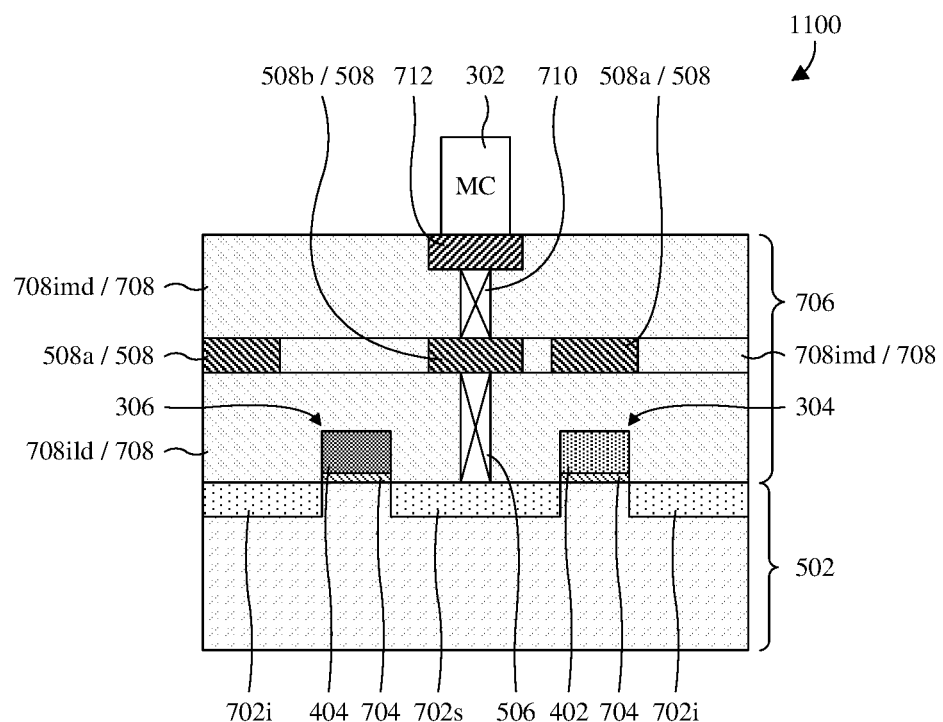

As illustrated by the cross-sectional view 1100 of FIG. 11, a memory structure 302 is formed on the interconnect structure 706. The memory structure 302 overlies the shared source/drain region 702*s* and is electrically coupled to the shared source/drain region 702*s* by the interconnect structure 706. The memory structure 302 may, for example, be an RRAM structure, an MRAM structure, or some other suitable memory structure.

In some embodiments, a process for forming the memory structure 302 comprises: 1) performing a series of depositions to form a memory film comprising a bottom electrode layer, a data storage layer, and a top electrode layer; and 2) patterning the memory film into the memory structure 302. The depositing of the bottom and top electrode layers may, for example, be performed by CVD, PVD, electroless plating, electroplating, some other suitable deposition process(es), or any combination of the foregoing. The depositing of the data storage layer may, for example, be performed by CVD, PVD, some other suitable deposition process(es), or any combination of the foregoing. The patterning may, for example, be performed by a photolithography/etching process or some other suitable deposition process(es).

Figure 12:
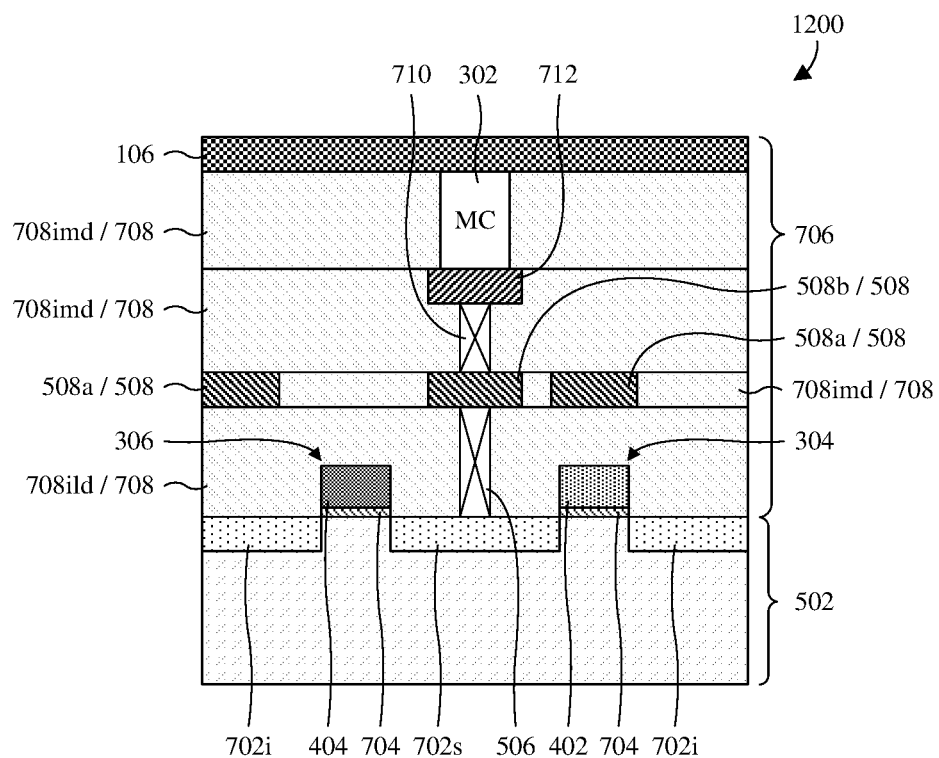

As illustrated by the cross-sectional view 1200 of FIG. 12, the interconnect structure 706 is extended around the memory structure 302, whereby an additional IMD layer 708*imd* and a bit line 106 are formed. The additional IMD layer 708*imd* surrounds the memory structure 302, and the bit line 106 overlies the additional IMD layer 708*imd*. Further, the bit line 106 electrically couples to the memory structure 302.

In some embodiments, a process for extending the interconnect structure 706 comprises: 1) depositing the additional IMD layer 708*imd*; 2) patterning the additional IMD layer 708*imd* with an opening having a layout of the bit line 106; 3) depositing a conductive layer filling the openings and covering the additional IMD layer 708*imd*; and 4) performing a planarization into the conductive layer until the dielectric layer is reached. The patterning may, for example, be performed by a photolithography/etching process or some other suitable patterning process. The depositing of the conductive layer may, for example, be performed by CVD, PVD, electroless plating, electroplating, some other suitable deposition process, or any combination of the foregoing. The planarization may, for example, be performed by a CMP or some other suitable planarization process.

While the cross-sectional views 800-1200 of FIGS. 8-12 are described with reference to the method, it will be appreciated that the structures shown in FIGS. 8-12 are not limited to the method and may stand alone without the method. Additionally, while FIGS. 8-12 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 13:
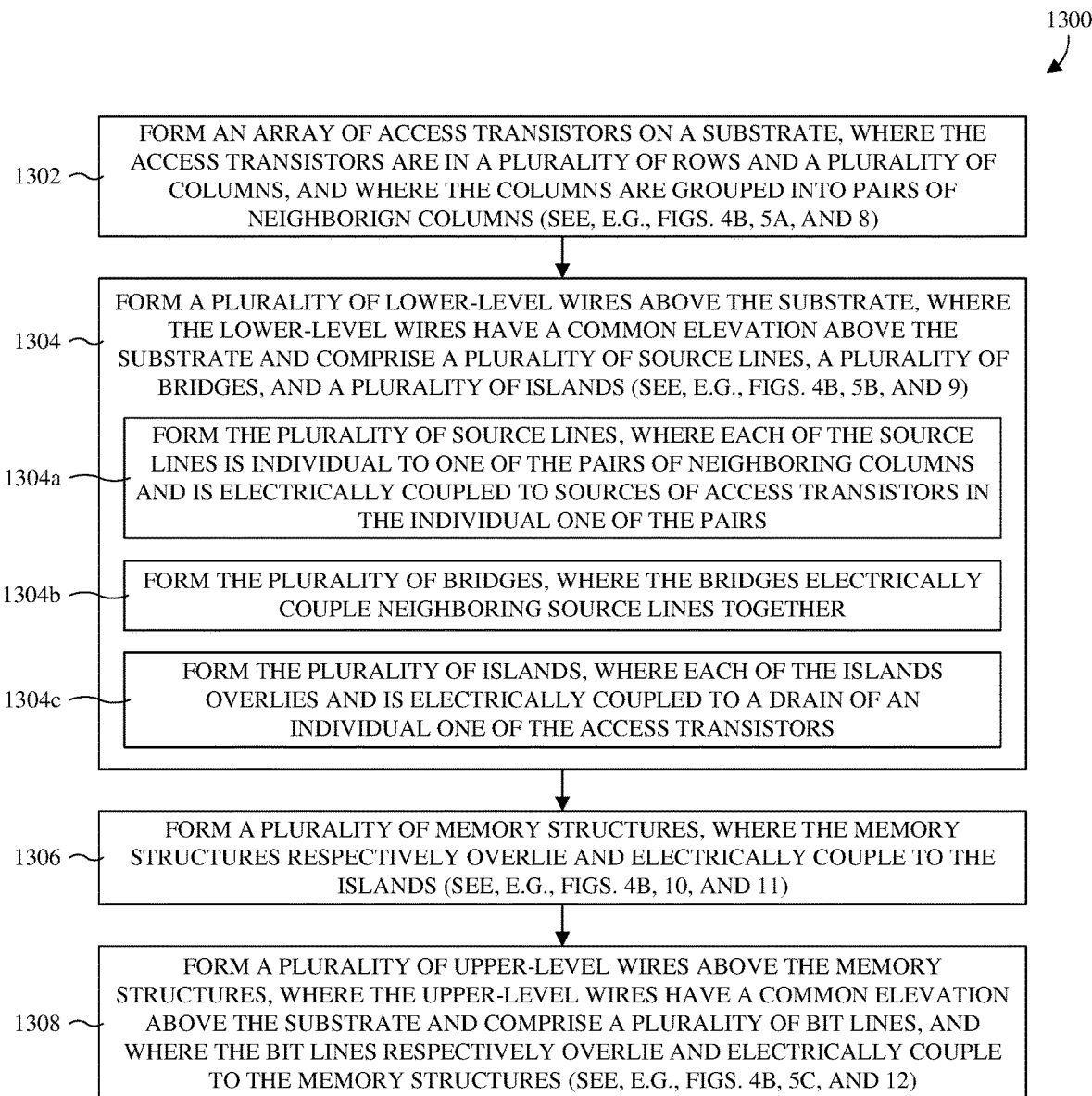
FIG. 13 illustrates a flowchart of some embodiments of the method of FIGS. 8-12.

With reference to FIG. 13, a flowchart 1300 of some embodiments of the method of FIGS. 8-12 is provided.

At 1302, an array of access transistors is formed on a substrate, where the access transistors are in a plurality of rows and a plurality of columns, and where the columns are grouped into pairs of neighboring columns. See, e.g., FIGS. 4B, 5A, and 8.

At 1304, a plurality of lower-level wires is formed above the substrate, where the lower-level wires have a common elevation above the substrate and comprise a plurality of source lines, a plurality of bridges, and a plurality of islands. See, e.g., FIGS. 4B, 5B, and 9.

At 1304a, the forming of the plurality of lower-level wires comprises forming the plurality of source lines, where each of the source lines is individual to one of the pairs of neighboring columns and is electrically coupled to sources of access transistors in the individual one of the pairs.

At 1304b, the forming of the plurality of lower-level wires comprises forming the plurality of bridges, where the bridges electrically couple neighboring source lines together. By electrically coupling neighboring source lines together, composite source lines form with effective widths greater than individual widths of the source lines and further have reduced resistances compared to the source lines. The reduced resistances reduce loading along the composite source lines, reduce voltage drops along the composite source lines, reduce the minimum read and write voltages, and reduce dynamic power consumption. As such, the memory device resulting from the method may have a single large bank of bit cells, instead of multiple small banks of bit cells, which increases memory density and reduces costs.

At 1304c, the forming of the plurality of lower-level wires comprises forming the plurality of islands, where each of the islands overlies and is electrically coupled to a drain of an individual one of the access transistors.

At 1306, a plurality of memory structures is formed, where the memory structures respectively overlie and electrically couple to the islands. See, e.g., FIGS. 4B, 10, and 11.

At 1308, a plurality of upper-level wires is formed above the memory structures, where the upper-level wires have a common elevation above the substrate and comprise a plurality of bit lines, and where the bit lines respectively overlie and electrically couple to the memory structures. See, e.g., FIGS. 4B, 5C, and 12.

While the flowchart 1300 of FIG. 13 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, the present application provides a memory device including: an array of bit cells including in a plurality of rows and a plurality of columns, wherein the plurality of columns includes a first column and a second column; a first conductive line extending along the first column, wherein the first conductive line is electrically coupled to bit cells of the array in the first column; a second conductive line extending along the second column, wherein the second conductive line is electrically coupled to bit cells of the array in the second column; and a plurality of conductive bridges extending from the first conductive line to the second conductive line and electrically coupling the first and second conductive lines together. In some embodiments, the plurality of columns further includes a third column and a fourth column, wherein the first conductive line extends along the third column and is electrically coupled to bit cells of the array in the third column, and wherein the second conductive line extends along the fourth column and is electrically coupled to bit cells of the array in the fourth column. In some embodiments, the conductive bridges are evenly spaced along the first column. In some embodiments, the conductive bridges are line shaped and extend transverse to the first and second conductive lines in parallel. In some embodiments, the plurality of conductive bridges includes a first conductive bridge and a second conductive bridge, and wherein the first and second conductive bridges border and are separated along the first column by two rows of the array. In some embodiments, the plurality of columns further includes a third column, wherein the memory device further includes a third conductive line that extends along the third column and is electrically coupled to bit cells of the array in the third column, and wherein the conductive bridges extend from the first column to the second column and from the second column to the third column. In some embodiments, the plurality of columns further includes a third column, wherein the conductive bridges extend between the first and second conductive lines, beginning and ending respectively at the first and second conductive lines; wherein the memory device further includes: a third conductive line that extends along the third column and is electrically coupled to bit cells of the array in the third column; and a plurality of second conductive bridges extending between the second and third conductive lines, beginning and ending respectively at the second and third conductive lines, wherein the conductive bridges and the second conductive bridges are spaced from each other and alternate along the second conductive line. In some embodiments, the bit cells of the array are 2T1R RRAM cells. In some embodiments, the bit cells of the array are 1T1R RRAM cells.

In some embodiments, the present application provides a method for forming a memory device, the method including: forming an array of access devices on a substrate, wherein the array of access devices includes a plurality of rows and a plurality of columns, and wherein the columns are grouped into pairs of neighboring columns; forming a plurality of wires over the array of access devices, wherein the plurality of wires includes: a plurality of source lines including a first source line and a second source line, wherein each of the source lines is individual to one of the pairs of neighboring columns and is electrically coupled to access devices of the array in the individual pair of neighboring columns; and a plurality of bridges extending between the first and second source lines and electrically coupling the first and second source lines together; and forming an array of memory structures over the plurality of wires, wherein the memory structures electrically couple to the access devices, respectively, through the wires. In some embodiments, the wires have a common elevation above the substrate, and wherein the first source line, the second source line, and the plurality of bridges are integrated together. In some embodiments, the forming of the plurality of wires includes: depositing a dielectric layer over the access devices; patterning the dielectric layer to form openings having a layout of the wires; depositing a conductive layer filling the openings and covering the dielectric layer; and performing a planarization into the conductive layer until the dielectric layer is reached. In some embodiments, the first and second source lines neighbor without intervening source lines. In some embodiments, the bridges are formed with line-shaped top layouts that begin and end respectively at the first and second source lines. In some embodiments, the method further includes: forming a plurality of second wires over the array of memory structures, wherein the plurality of second wires includes a bit line between the first and second source lines, and wherein the bit line is individual to one of the columns and is electrically coupled to memory structures overlying the individual column.

In some embodiments, the present application provides another memory device including: an array of bit cells, wherein the array includes a plurality of rows and a plurality of columns, and wherein the plurality of columns includes a first pair of neighboring columns and a second pair of neighboring columns; and a conductive structure electrically coupled to bit cells of the array in the first and second pairs of neighboring columns, wherein the conductive structure has a ladder-shaped top layout in which legs of the ladder-shaped top layout are elongated respectively along the first and second pairs of neighboring columns. In some embodiments, the bit cells of the array include individual access transistors, wherein the conductive structure electrically couples to first source/drain regions of access transistors in each column of the first and second pairs of neighboring columns. In some embodiments, the bit cells of the array include individual memory structures, wherein the memory structures respectively overlie and electrically couple to second source/drain regions of the access transistors. In some embodiments, rungs of the ladder-shaped top layout have a two-row pitch and are elongated transverse to the columns of the array. In some embodiments, the plurality of columns includes a third pair of neighboring columns, and wherein the first and second pairs of neighboring columns are separated by the third pair of neighboring columns.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a memory device, the method comprising:
   forming an array of access devices on a substrate, wherein the array of access devices comprises a plurality of rows, a first pair of columns, and a second pair of columns;
   forming an interconnect structure over the array of access devices, wherein the interconnect structure comprises a plurality of wires and defines a first source line and a second source line, and wherein the first and second source lines are electrically coupled to access devices of the array respectively in the first and second pairs of columns;
   depositing a dielectric layer over the array of access devices;
   patterning the dielectric layer to form a plurality of openings elongated along the rows;
   filling the openings with a conductive material to form a plurality of bridges in the openings, wherein the bridges at least partially define conductive paths electrically coupling the first source line to the second source line; and
   forming an array of memory structures over the interconnect structure and the plurality of bridges, wherein the memory structures are respectively and electrically coupled to the access devices through the interconnect structure.

2. The method according to claim 1, wherein the first and second source lines and the bridges have a common elevation above the substrate and are integrated together.

3. The method according to claim 1, wherein the filling comprises:
   depositing the conductive material filling the openings and covering the dielectric layer; and
   performing a planarization into the conductive material until the dielectric layer is reached.

4. The method according to claim 1, wherein the first and second source lines neighbor without intervening source lines.

5. The method according to claim 1, wherein the openings have line-shaped top layouts that begin and end respectively and directly over the first pair of columns and the second pair of columns.

6. The method according to claim 1, further comprising:
   forming a plurality of additional wires over the array of memory structures, wherein the plurality of additional wires comprises a bit line wire laterally between the first and second source lines, and wherein the bit line wire is individual to a column in the array of access devices and is electrically coupled to memory structures overlying the column.

7. The method according to claim 1, wherein the patterning defines a pair of additional openings simultaneously with the plurality of openings, wherein the additional openings are elongated respectively along the first pair of columns and the second pair of columns, wherein the openings are between and connect to the additional openings, and wherein the first and second source lines are formed respectively in the additional openings.

8. A method comprising:
   forming an array of transistors overlying a substrate, wherein the array comprises a plurality of rows, a first column, and a second column;
   depositing a first dielectric layer covering the array;
   forming a plurality of first conductive features within the first dielectric layer and electrically coupled to the transistors;
   depositing a second dielectric layer covering the first conductive features;
   performing an etch selectively into the second dielectric layer to form a first trench and a second trench elongated respectively along the first and second columns, wherein the first and second trenches partially expose at least some of the first conductive features;
   filling the first and second trenches with a conductive material to form a first wire and a second wire respectively in the first and second trenches; and
   electrically coupling the first wire to the second wire.

9. The method according to claim 8, wherein the plurality of first conductive features comprises contact vias extending from a top surface of the first dielectric layer respectively to the transistors.

10. The method according to claim 8, wherein the first and second wires electrically couple to source/drain regions of the transistors through the first conductive features.

11. The method according to claim 8, wherein the etch further defines a third trench extending from the first trench to the second trench, and wherein the method further comprises:

filling the third trench with the conductive material while filling the first and second trenches with the conductive material to define a conductive bridge electrically coupling the first wire to the second wire.

12. The method according to claim 8, wherein the filling comprises:

depositing the conductive material in the first and second trenches and covering the second dielectric layer; and removing the conductive material from atop the second dielectric layer.

13. The method according to claim 8, wherein the method further comprises:

forming an array of memory structures overlying the first and second wires.

14. The method according to claim 8, wherein the first and second trenches correspond to legs of a ladder-shaped openings formed in the second dielectric layer by the etch.

15. A method comprising:

forming an array of transistors overlying a substrate, wherein the array comprises a plurality of rows, a first column, and a second column;

depositing a first dielectric layer covering the array while forming a plurality of first metal features and a plurality of second metal features, wherein the first and second metal features are embedded in the first dielectric layer and electrically coupled to transistors of the array respectively in the first and second columns;

patterning the first dielectric layer to form an opening, wherein the opening has a first column segment and a second column segment extending respectively along the first and second columns, from one side of the array to an opposite side of the array, and respectively exposing at least some of the first and second metal features, and wherein the opening further has a bridge segment connecting the first column segment to the second column segment;

depositing a metal layer filling the opening and covering the first dielectric layer; and performing a planarization into the metal layer to remove the metal layer from atop the first dielectric layer.

16. The method according to claim 15, wherein first and second metal features exposed in the opening include contact vias extending to the substrate.

17. The method according to claim 15, wherein the bridge segment of the opening begins and ends respectively and directly over the first and second columns.

18. The method according to claim 15, wherein the patterning is performed by a photolithography/etching process.

19. The method according to claim 15, wherein the patterning forms an additional opening at a common elevation above the substrate as the opening, wherein the opening extends in a closed path around the additional opening, wherein the metal layer is deposited filling the additional opening, and wherein the method further comprises:

forming a memory structure directly over and electrically coupled to a portion of the metal layer in the additional opening after the planarization.

20. The method according to claim 15, further comprising:

forming a trench isolation structure (TIS) in the substrate, wherein the TIS has a first line-shaped segment, a second line-shaped segment, and a third line-shaped segment that are elongated in parallel along the first and second columns, wherein transistors of the array in the first column are between and border the first and second line-shaped segments of the TIS, wherein transistors of the array in the second column are between and border the second and third line-shaped segments of the TIS, and wherein the first and second column segments of the opening respectively overlie the first and third line-shaped segments of the TIS.

* * * * *